United States Patent
Sato et al.

(10) Patent No.: US 11,482,415 B2
(45) Date of Patent: Oct. 25, 2022

(54) SUBSTRATE PROCESSING APPARATUS, METHOD OF MANUFACTURING SEMICONDUCTOR DEVICE, AND NON-TRANSITORY COMPUTER-READABLE RECORDING MEDIUM

(71) Applicant: KOKUSAI ELECTRIC CORPORATION, Tokyo (JP)

(72) Inventors: Akihiro Sato, Toyama (JP); Daisuke Hara, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 9 days.

(21) Appl. No.: 16/820,047

(22) Filed: Mar. 16, 2020

(65) Prior Publication Data
US 2020/0219717 A1 Jul. 9, 2020

Related U.S. Application Data

(63) Continuation of application No. PCT/JP2018/034608, filed on Sep. 19, 2018.

(30) Foreign Application Priority Data

Sep. 22, 2017 (JP) .............................. JP2017-183070

(51) Int. Cl.
*H01J 37/32* (2006.01)
*H01L 21/02* (2006.01)
(Continued)

(52) U.S. Cl.
CPC .... *H01L 21/0228* (2013.01); *C23C 16/45536* (2013.01); *C23C 16/505* (2013.01);
(Continued)

(58) Field of Classification Search
CPC . C23C 16/54; C23C 16/45551; C23C 16/545; C23C 16/4401; H01L 21/6719;
(Continued)

(56) References Cited

U.S. PATENT DOCUMENTS

| | | | |
|---|---|---|---|
| 2012/0100722 A1 | 4/2012 | Asai et al. | |
| 2012/0220137 A1* | 8/2012 | Ota | C23C 16/45546 |
| | | | 438/765 |
| 2014/0170858 A1 | 6/2014 | Harada et al. | |

FOREIGN PATENT DOCUMENTS

| JP | 2012-094652 A | 5/2012 |
|---|---|---|
| JP | 2012-175077 A | 9/2012 |

(Continued)

OTHER PUBLICATIONS

Japanese Office Action dated Sep. 29, 2020 for Japanese Patent Application No. 2019-543667.

(Continued)

*Primary Examiner* — Rudy Zervigon
(74) *Attorney, Agent, or Firm* — Volpe Koenig

(57) ABSTRACT

A substrate processing apparatus includes: a process chamber configured to process a substrate; a precursor gas supply section for supplying a precursor gas; a reactant gas supply section for supplying a reactant gas; an exhauster for exhausting the process chamber; a plasma generator including first and second plasma generators for converting the reactant gas into plasma to activate the reactant gas, the first and second plasma generators being disposed so that a straight line passing through the center of the process chamber and the exhauster is interposed therebetween; and a gas rectifier including a first partition member disposed along an inner wall of the process chamber between the precursor gas supply section and the first plasma generator, and a second partition member disposed at an outer circumferential portion of the substrate along an inner wall of the (Continued)

process chamber between the precursor gas supply section and the second plasma generator.

9 Claims, 13 Drawing Sheets

(51) Int. Cl.
    *C23C 16/455*     (2006.01)
    *C23C 16/505*     (2006.01)
    *H01L 21/67*     (2006.01)
    *C23C 16/44*     (2006.01)

(52) U.S. Cl.
    CPC .......... *H01J 37/32* (2013.01); *H01J 37/3244* (2013.01); *H01J 37/32091* (2013.01); *H01J 37/32834* (2013.01); *H01L 21/67017* (2013.01); *C23C 16/4412* (2013.01); *C23C 16/45502* (2013.01); *H01L 21/67* (2013.01)

(58) Field of Classification Search
    CPC ......... H01L 21/67196; H01L 21/67201; H01L 21/67173; H01L 21/67184; H01L 21/6776; H01L 21/67161; H01L 21/67155
    USPC ................. 118/715, 723 E, 719; 156/345.43, 156/345.44, 345.45, 345.31, 345.32
    See application file for complete search history.

(56) References Cited

FOREIGN PATENT DOCUMENTS

| | | |
|---|---|---|
| JP | 2014-135475 A | 7/2014 |
| JP | 2016-106415 A | 6/2016 |

OTHER PUBLICATIONS

International Search Report, PCT/JP2018/034608, dated Oct. 30, 2018, 2 pgs.

\* cited by examiner

SUBSTRATE PROCESSING APPARATUS, METHOD OF MANUFACTURING SEMICONDUCTOR DEVICE, AND NON-TRANSITORY COMPUTER-READABLE RECORDING MEDIUM

CROSS-REFERENCE TO RELATED APPLICATIONS

This application is a Continuation Application of International Application No. PCT/JP2018/034608, filed on Sep. 19, 2018, which claims priority to Japanese Patent Application No. 2017-183070, filed on Sep. 22, 2017. The entire contents of these applications are incorporated herein by reference.

TECHNICAL FIELD

The present disclosure relates to a substrate processing apparatus, a method of manufacturing a semiconductor device, and a non-transitory computer-readable recording medium.

In one of the processes of manufacturing a semiconductor device, a precursor gas or a reactant gas is activated by plasma and supplied to a substrate accommodated in a process chamber of a substrate processing apparatus, various films such as insulating films, semiconductor films, or conductor films are formed on the substrate, and substrate processing for removing various films is performed. The plasma is used to accelerate a chemical reaction that occurs when depositing thin films, to remove impurities from the thin films, or to assist a chemical reaction of a film-forming source (see, for example, JP 2015-92637 A.

SUMMARY

In a processing apparatus that generates plasma using a plurality of radio frequency (RF) power supplies, a difference in frequency between the respective RF power supplies may cause noise that interferes with each other. Therefore, in some cases, stable plasma generation could not be performed.

According to one aspect of the technology described herein, a technology capable of processing a substrate uniformly is provided.

According to one aspect of the present disclosure, there is provided a technology including: a process chamber configured to process a substrate; a precursor gas supply section provided in the process chamber and configured to supply a precursor gas; a reactant gas supply section provided in the process chamber and configured to supply a reactant gas; an exhauster configured to exhaust the process chamber; a plasma generator including a first plasma generator and a second plasma generator configured to convert the reactant gas into plasma, wherein the first plasma generator and the second plasma generator are disposed so that a straight line passing through the center of the process chamber and the exhauster is interposed therebetween; and a gas rectifier including a first partition member disposed at a certain distance from an edge portion of the substrate along an inner wall of the process chamber between the precursor gas supply section and the first plasma generator, and a second partition member disposed at a certain distance from an outer circumferential portion of the substrate along an inner wall of the process chamber between the precursor gas supply section and the second plasma generator.

DETAILED DESCRIPTION

Hereinafter, an embodiment of the present disclosure will be described with reference to FIGS. 1 to 8.

Figure 1:
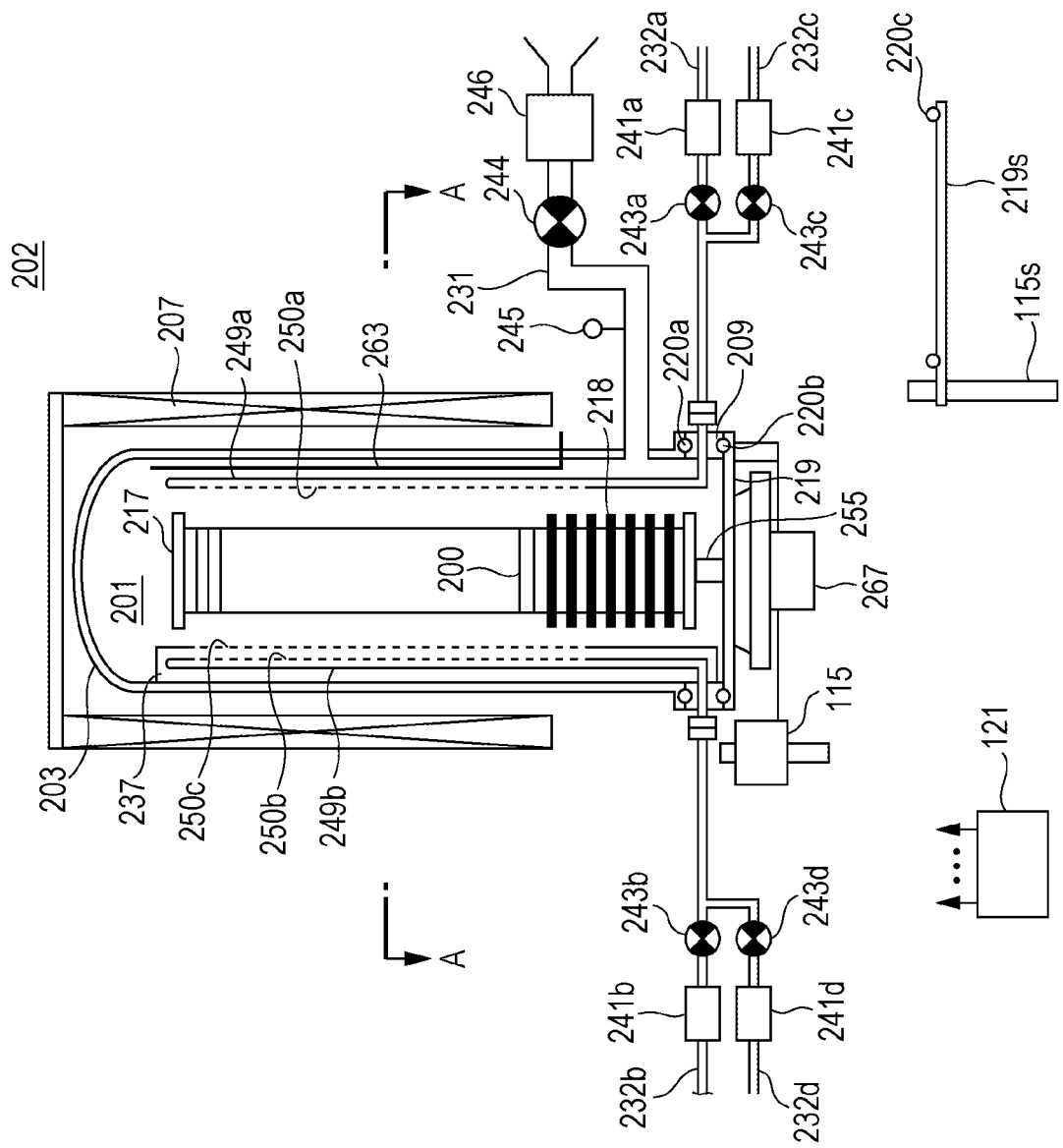
FIG. 1 is a schematic configuration diagram of a vertical process furnace of a substrate processing apparatus suitably used in an embodiment of the present disclosure and a longitudinal sectional view of a process furnace portion.

As illustrated in FIG. 1, a process furnace 202 is a so-called vertical furnace capable of accommodating substrates in multiple stages in a vertical direction and includes a heater 207 serving as a heating device (heating mechanism). The heater 207 has a cylindrical shape and is supported to a heater base serving as a holding plate such that the heater 207 is vertically installed. As described later, the heater 207 also functions as an activation mechanism (excitation section) that activates (excites) a gas by heat.

In the heater 207, a reaction tube 203 is disposed concentrically with the heater 207. The reaction tube 203 is made of a heat resistant material, such as quartz ($SiO_2$) or silicon carbide (SiC), and is formed in a cylindrical shape with a closed upper end and an opened lower end. Under the reaction tube 203, a manifold (inlet flange) 209 is disposed concentrically with the reaction tube 203. The manifold 209 is made of a metal, such as stainless steel (SUS), and is formed in a cylindrical shape with an opened upper end and an opened lower end. An upper end portion of the manifold 209 is configured to be engaged with a lower end portion of the reaction tube 203 so as to support the reaction tube 203. An O-ring 220a serving as a seal member is provided between the manifold 209 and the reaction tube 203. Since the manifold 209 is supported to the heater base, the reaction tube 203 is in a state of being vertically installed. A process vessel (reaction vessel) is mainly configured by the reaction tube 203 and the manifold 209. A process chamber 201 is formed in a cylindrical hollow portion that is the inside of the process vessel. The process chamber 201 is configured such that wafers 200 as a plurality of sheets of substrates are accommodated. The process vessel is not limited to the above-described configuration, and the reaction tube 203 alone may be referred to as the process vessel.

In the process chamber 201, nozzles 249a, 249b, and 249c are provided to pass through a sidewall of the manifold 209. A gas supply pipe 232a is connected to the nozzle 249a. Gas supply pipes 232b are respectively connected to the nozzles 249b and 249c. The three nozzles 249a, 249b, and 249c and the two gas supply pipes 232a and 232b are provided in the reaction tube 203 as described above, such that a plurality of types of gases are supplied to the process chamber 201. In order to simplify the drawings and facilitate the understanding of the drawings, the illustration of the nozzle 249c is omitted in FIG. 1. The nozzle 249c will be described in detail with reference to FIG. 2.

Mass flow controllers (MFCs) 241a and 241b serving as flow rate controllers (flow rate control sections) and valves 243a and 243b serving as on-off valves are respectively provided in the gas supply pipes 232a and 232b in this order from the upstream side of gas flow. Gas supply pipes 232c and 232d configured to supply an inert gas are respectively connected to the downstream sides of the valves 243a and 243b of the gas supply pipes 232a and 232b. MFCs 241c and 241d and valves 243c and 243d are respectively provided in the gas supply pipes 232c and 232d in this order from the upstream side of gas flow.

Figure 2:
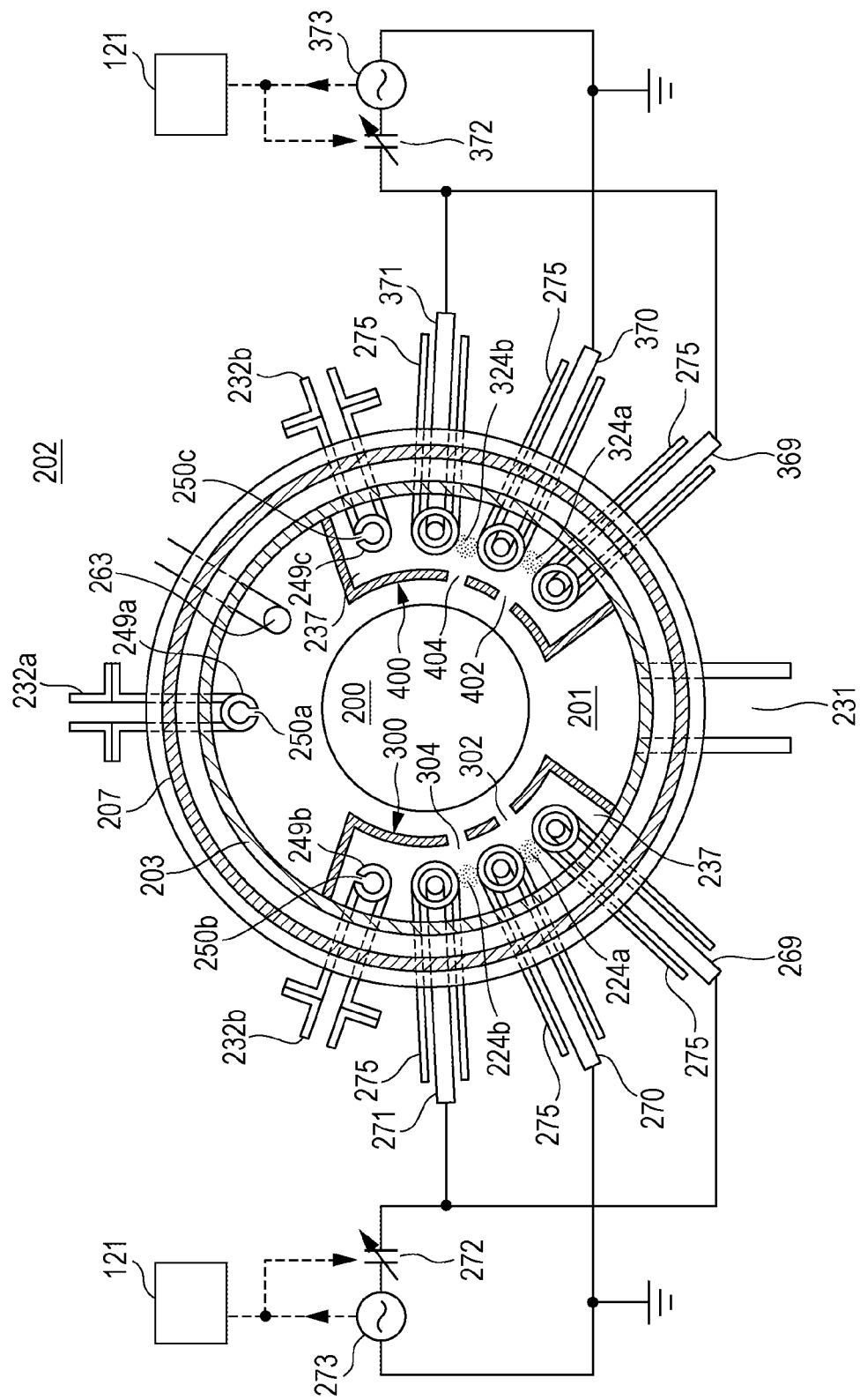
FIG. 2 is a schematic configuration diagram of the vertical process furnace of the substrate processing apparatus suitably used in the embodiment of the present disclosure and a sectional view of the process furnace portion, taken along line A-A of FIG. 1.

As illustrated in FIG. 2, the nozzle 249a is provided in a space between the inner wall of the reaction tube 203 and the wafers 200, so as to rise upward in the stacking direction of the wafers 200 along the upper portion from the lower portion of the inner wall of the reaction tube 203. That is, the nozzle 249a is provided along the wafer arrangement region in a region horizontally surrounding a wafer arrangement region, at a side of the wafer arrangement region (stacked region) in which the wafers 200 are arranged (stacked). Namely, the nozzle 249a is provided in a direction perpendicular to the surface (flat surface) of the wafer 200 at the side of the end portion (circumferential portion) of each wafer 200 loaded into the process chamber 201. A gas supply hole 250a configured to supply gas is provided on the side surface of the nozzle 249a. The gas supply hole 250a is opened to face the center of the reaction tube 203, such that the gas can be supplied toward the wafers 200. The gas supply hole 250a is plurally provided from the lower portion to the upper portion of the reaction tube 203, and the plurality of gas supply holes 250a have the same opening area and are provided at the same opening pitch.

The nozzle 249b is connected to the tip portion of the gas supply pipe 232b. The nozzle 249b is provided in a buffer chamber 237 that is a gas dispersion space. As illustrated in FIG. 2, when seen in a plan view, the buffer chamber 237 is provided in the annular space between the inner wall of the reaction tube 203 and the wafers 200, in the region from the lower portion to the upper portion of the inner wall of the reaction tube 203 in the stacking direction of the wafers 200. That is, the buffer chamber 237 is formed by a buffer structure (first buffer structure) 300 in a region horizontally surrounding the wafer arrangement region at the side of the wafer arrangement region along the wafer arrangement region. The buffer structure 300 is made of an insulating material such as quartz, and gas supply ports 302 and 304 configured to supply gas are formed on the wall portion, which is formed in an arc shape, of the buffer structure 300. As illustrated in FIG. 2, the gas supply ports 302 and 304 are opened so as to face the center of the reaction tube 203 between rod-shaped electrodes 269 and 270, which will be described later, at positions facing plasma generation regions 224a and 224b between the rod-shaped electrodes 270 and 271, respectively, and can supply gas toward the wafers 200. The gas supply ports 302 and 304 are plurally provided from the lower portion to the upper portion of the reaction tube 203, and the plurality of gas supply ports have the same opening area and are provided at the same opening pitch.

The nozzle 249b is provided so as to rise upward along the upper portion from the lower portion of the inner wall of the reaction tube 203 in the stacking direction of the wafers 200. That is, the nozzle 249b is provided in a region horizontally surrounding a wafer arrangement region, which is the inside of the buffer structure 300, at the side of the wafer arrangement region in which the wafers 200 are arranged, along the wafer arrangement region. That is, the nozzle 249b is provided in a direction perpendicular to the surface of the wafer 200 at the side of the end portion of the wafer 200 loaded into the process chamber 201. A gas supply hole 250b configured to supply gas is provided on the side surface of the nozzle 249b. The gas supply hole 250b is opened so as to face the wall surface formed in a radial direction with respect to the arc-shaped wall surface of the buffer structure 300 and can supply gas toward the wall surface. Therefore, the reactant gas is dispersed in the buffer chamber 237 in the buffer structure 300 and is not directly sprayed on the rod-shaped electrodes 269 to 271, thereby suppressing generation of particles. Similar to the gas supply hole 250a, the gas supply hole 250b is plurally provided from the lower portion to the upper portion of the reaction tube 203. Inside the buffer structure 300, the rod-shaped electrodes 269, 270, and 271 and the nozzle 249b that are respectively covered with electrode protection pipes 275 are provided.

A buffer structure (second buffer structure) 400 having the same configuration as the buffer structure 300 is further provided on the inner wall of the reaction tube 203. Inside the buffer structure 400, rod-shaped electrodes 369, 370, and 371 and the nozzle 249c that are respectively covered with the electrode protection pipes 275 are provided. Of the rod-shaped electrodes 369, 370, and 371, the rod-shaped electrodes 369 and 371 disposed at both ends are connected to a radio frequency (RF) power supply 373 through a matcher 372, and the rod-shaped electrode 370 is connected to the ground, which is a reference potential, and is grounded. The nozzle 249c is connected to the gas supply pipe 232b and can supply the same gas as the nozzle 249b. A plurality of gas supply holes 250c configured to supply gas are provided on the side surface of the nozzle 249c from the lower portion to the upper portion of the reaction tube 203. The gas supply hole 250c is opened so as to face the wall surface formed in a radial direction with respect to the arc-shaped wall surface of the buffer structure 400 and can supply gas toward the wall surface. Gas supply ports 402 and 404 configured to supply gas in the buffer chamber 237 are provided on the wall surface, which is formed in an arc shape, of the buffer structure 400. The gas supply ports 402 and 404 are plurally provided from the lower portion to the upper portion of the reaction tube 203 and are opened at positions facing the plasma generation regions 324a and 324b between the rod-shaped electrodes 369 and 370 and between the rod-shaped electrodes 370 and 371 so as to face the center of the reaction tube 203, and the plurality of gas supply ports have the same opening area and are provided at the same opening pitch.

The nozzle 249c is provided so as to rise upward along the upper portion from the lower portion of the inner wall of the reaction tube 203 in the stacking direction of the wafers 200. That is, the nozzle 249c is provided in a region horizontally surrounding a wafer arrangement region, which is the inside of the buffer structure 400, at the side of the wafer arrangement region in which the wafers 200 are arranged, along the wafer arrangement region. That is, the nozzle 249c is provided in a direction perpendicular to the surface of the wafer 200 at the side of the end portion of the wafer 200 loaded into the process chamber 201. A gas supply hole 250c configured to supply gas is provided on the side surface of the nozzle 249c. The gas supply hole 250c is opened so as to face the wall surface formed in a radial direction with respect to the arc-shaped wall surface of the buffer structure 400 and can supply gas toward the wall surface. Therefore, the reactant gas is dispersed in the buffer chamber 237 in the buffer structure 400 and is not directly sprayed on the rod-shaped electrodes 369 to 371, thereby suppressing generation of particles. Similar to the gas supply hole 250a, the gas supply hole 250c is plurally provided from the lower portion to the upper portion of the reaction tube 203.

As illustrated in FIG. 2, when seen in a plan view, the buffer structure 300 and the buffer structure 400 are provided line-symmetrically with respect to a straight line passing through the exhaust pipe 231 and the center of the reaction tube 203, with the exhaust pipe (exhauster) 231 interposed therebetween. In addition, when seen in a plan view, the nozzle 249a is provided in the reaction tube 203 at a position facing the exhaust pipe 231, with the wafer 200 interposed therebetween. Furthermore, the nozzle 249b and the nozzle 249c are respectively provided at positions far from the exhaust pipe 231 in the buffer chamber 237.

As such, in the present embodiment, the gas is carried through the nozzles 249a, 249b, and 249c and the buffer chamber 237 disposed in the annular vertically-long space, when seen in a plan view, that is, the cylindrical space, which is defined by the inner wall of the sidewall of the reaction tube 203 and the end portions of the plurality of wafers 200 arranged in the reaction tube 203. The gas is ejected from the gas supply holes 250a, 250b, and 250c and the gas supply ports 302, 304, 402, and 404, which are respectively opened in the nozzles 249a, 249b, and 249c and the buffer chamber 237, to the reaction tube 203 for the first time in the vicinity of the wafer 200. A main flow of the gas in the reaction tube 203 is set to a direction parallel to the surface of the wafer 200, that is, a horizontal direction. With such a configuration, it is possible to uniformly supply the gas to each of the wafers 200 and to improve the film thickness uniformity of a film to be formed in each of the wafers 200. A gas flowing on the surface of the wafer 200, that is, a gas remaining after reaction, flows in a direction of an exhaust port, that is, an exhaust pipe 231 to be described later. However, the direction of the flow of the remaining gas is appropriately specified according to the position of the exhaust port and is not limited to a vertical direction.

As a precursor containing a predetermined element, for example, a silane precursor gas containing silicon (Si) as a predetermined element is supplied from the gas supply pipe 232a to the process chamber 201 through the MFC 241a, the valve 243a, and the nozzle 249a.

The precursor gas is a precursor of a gaseous state, for example, a gas obtained by vaporizing a precursor that is a liquid state under normal temperature and normal pressure, or a precursor that is a gaseous state under normal temperature and normal pressure. A case in which the term "precursor" is used in this specification is a case of "a liquid precursor that is in a liquid state", a case of a "precursor gas that is in a liquid state", or a case of both of them.

As the silane precursor gas, for example, a precursor gas containing Si and a halogen element, that is, a halosilane precursor gas can be used. The halosilane precursor is a silane precursor having a halogen group. The halogen element includes at least one selected from the group consisting of chlorine (Cl), fluorine (F), bromine (Br), and iodine (I). That is, the halosilane precursor includes at least one halogen group selected from the group consisting of a chloro group, a fluoro group, a bromo group, and an iodo group. The halosilane precursor is also referred to as a type of a halide.

As the halosilane precursor gas, for example, a precursor gas containing Si and Cl, that is, a chlorosilane precursor gas can be used. As the chlorosilane precursor gas, for example, a dichlorosilane ($SiH_2Cl_2$, DCS) gas can be used.

As the reactant containing an element different from the above-described predetermined element, for example, a nitrogen (N)-containing gas as the reactant gas is configured to be supplied from the gas supply pipe 232b into the process chamber 201 through the MFC 241b, the valve 243b, and the nozzles 249b and 249c. As the N-containing gas, for example, a hydrogen nitride-based gas can be used. The hydrogen nitride-based gas is a material consisting of two elements, i.e., N and H, and acts as a nitriding gas, that is, an N source. As the hydrogen nitride-based gas, for example, ammonia ($NH_3$) gas can be used.

As an inert gas, for example, a nitrogen ($N_2$) gas is supplied from the gas supply pipes 232c and 232d into the process chamber 201 through the MFCs 241c and 241d, the valves 243c and 243d, the gas supply pipes 232a and 232b, and the nozzles 249a, 249b, and 249c.

A precursor supply system as a first gas supply system is mainly configured by the gas supply pipe 232a, the MFC 241a, and the valve 243a. A reactant supply system as a second gas supply system is mainly configured by the gas supply pipe 232b, the MFC 241b, and the valve 243b. An inert gas supply system is mainly configured by the gas supply pipes 232c and 232d, the MFCs 241c and 241d, and the valves 243c and 243d. The precursor supply system, the reactant supply system, and the inert gas supply system are simply and collectively referred to as a gas supply system (gas supply unit).

Inside the buffer chamber 237, as illustrated in FIG. 2, six rod-shaped electrodes 269, 270, 271, 369, 370, and 371, each of which has an elongated structure and serves as a conductor, are disposed from the lower portion to the upper portion of the reaction tube 203 in the stacking direction of the wafers 200. Each of the rod-shaped electrodes 269, 270, and 271 is provided in parallel to the nozzle 249b. In addition, each of the rod-shaped electrodes 369, 370, and 371 is provided in parallel to the nozzle 249c.

Each of the rod-shaped electrodes 269, 270, and 271 is covered with and protected by an electrode protection pipe 275 from the upper portion to the lower portion thereof. Of the rod-shaped electrodes 269, 270, and 271, the rod-shaped electrodes 269 and 271 disposed at both ends are connected to the RF power supply 273 through the matcher 272, and the rod-shaped electrode 270 is connected to the ground, which is a reference potential, and is grounded. That is, the rod-shaped electrode connected to the RF power supply 273 and the rod-shaped electrode to be grounded are alternately arranged, and the rod-shaped electrode 270 disposed between the rod-shaped electrodes 269 and 271 connected to the RF power supply 273 is commonly used for the rod-shaped electrodes 269 and 271 as the grounded rod-shaped electrode. In other words, the grounded rod-shaped electrode 270 is disposed so as to be sandwiched between the rod-shaped electrodes 269 and 271 connected to the adjacent RF power supply 273, and the rod-shaped electrode 269 and the rod-shaped electrode 270, and similarly, the rod-shaped electrode 271 and the rod-shaped electrode 270 are configured to form a pair to generate plasma. That is, the grounded rod-shaped electrode 270 is commonly used for the rod-shaped electrodes 269 and 271 connected to the two RF power supplies 273 adjacent to the rod-shaped electrode 270. By applying RF power from the RF power supply 273 to the rod-shaped electrodes 269 and 271, plasma is generated in a plasma generation region 224a between the rod-shaped electrodes 269 and 270 and a plasma generation region 224b between the rod-shaped electrodes 270 and 271. Mainly, the rod-shaped electrodes 269, 270, and 271 and the electrode protection pipe 275 constitute the plasma generator (first plasma generator, plasma generation device) as the plasma source. The matcher 272 and the RF power supply 273 may be included in the plasma source. The plasma source functions as a plasma excitation section (activation mechanism) configured to excite gas to generate plasma, that is, to excite (activate) gas to a plasma state as described later.

Each of the rod-shaped electrodes 369, 370, and 371 is covered with and protected by the electrode protection pipe 275 from the upper portion to the lower portion thereof. Of the rod-shaped electrodes 369, 370, and 371, the rod-shaped electrodes 369 and 371 disposed at both ends are connected to the RF power supply 373 through the matcher 372, and the rod-shaped electrode 370 is connected to the ground, which is a reference potential, and is grounded. That is, the rod-shaped electrode connected to the RF power supply 373 and the rod-shaped electrode to be grounded are alternately arranged, and the rod-shaped electrode 370 disposed between the rod-shaped electrodes 369 and 371 connected to the RF power supply 373 is commonly used for the rod-shaped electrodes 369 and 371 as the grounded rod-shaped electrode. Namely, the grounded rod-shaped electrode 370 is disposed so as to be sandwiched between the rod-shaped electrodes 369 and 371 connected to the adjacent high-frequency power supply 373, and the rod-shaped electrode 369 and the rod-shaped electrode 370, and similarly, the rod-shaped electrode 371 and the rod-shaped electrode 370 are configured to form a pair to generate plasma. That is, the grounded rod-shaped electrode 370 is commonly used for the rod-shaped electrodes 369 and 371 connected to the two RF power supplies 373 adjacent to the rod-shaped electrode 370. By applying RF power from the RF power supply 373 to the rod-shaped electrodes 369 and 371, plasma is generated in a plasma generation region 324a between the rod-shaped electrodes 369 and 370 and a plasma generation region 324b between the rod-shaped electrodes 370 and 371. Mainly, the rod-shaped electrodes 369, 370, and 371 and the electrode protection pipe 275 constitute the plasma generator (second plasma generator, plasma generation device) as the plasma source. The matcher 372 and the RF power supply 373 may be included in the plasma source. The plasma source functions as a plasma excitation section (activation mechanism) configured to excite gas to generate plasma, that is, to excite (activate) gas to a plasma state as described later.

As illustrated in FIG. 2, the first plasma generator (269, 270, 271) and the second plasma generator (369, 370, 371) are provided on the left and right sides of the exhaust pipe 231 constituting the exhauster. The first plasma generator and the second plasma generator are disposed with a straight line passing through the center of the process chamber 201 and the exhaust pipe 231 interposed therebetween. In addition, the buffer structures 300 and 400 include the RF power supplies 273 and 373 and the matchers 272 and 372, respectively. Each of the RF power supplies 273 and 373 is connected to the controller 121, and plasma control can be performed for each buffer chamber 237 of the buffer structures 300 and 400. That is, the controller 121 independently controls the respective RF power supplies 273 and 373 by monitoring the impedance of each plasma generator so as not to cause a bias in the amount of active species for each buffer chamber 237, and when the impedance is large, the controller 121 executes a control such that the power supply of the RF power supply becomes high. Therefore, compared to the case in which there is one plasma generator, a sufficient amount of active species can be supplied to the wafer even if the RF power of each plasma generator is reduced, thereby improving in-plane uniformity of the wafer. In addition, contrary to the case where the plasma control is performed by one RF power supply with respect to the two plasma generators, by providing the RF power supply for each plasma generator, it becomes easier to grasp a case in which an abnormality such as disconnection occurs in each plasma generator. Furthermore, since it becomes easy to adjust the distance between the RF power supply and each electrode, it is possible to easily suppress the difference in the application of RF power caused by the difference in the distance between each electrode and the RF power supply. From FIG. 2, the plasma generation section deletes the matcher 372 and the RF power supply 373, and the six rod-shaped electrodes 269, 270, 271, 369, 370, and 371 may be controlled by a pair of the matcher 272 and the RF power supply 373.

The electrode protection pipes 275 are configured such that each of the rod-shaped electrodes 269, 270, 271, 369, 370, and 371 can be inserted into the buffer chamber 237 in a state of being isolated from an atmosphere inside the buffer chamber 237. When the $O_2$ concentration in the electrode protection pipes 275 is approximately equal to the $O_2$ concentration in the outside air (atmosphere), the rod-shaped electrodes 269, 270, 271, 369, 370, and 371 respectively inserted into the electrode protection pipes 275 are oxidized by heat generated by the heater 207. Therefore, the insides of the electrode protection pipes 275 are filled with an inert gas, such as an $N_2$ gas, or are purged with an inert gas, such as an $N_2$ gas, by using an inert gas purge mechanism such that the O$_2$ concentration in the electrode protection pipes 275 can be reduced to thereby prevent the oxidation of the rod-shaped electrodes 269, 270, 271, 369, 370, and 371.

As illustrated in FIG. 1, an exhaust pipe 231 is provided in the reaction tube 203 as an exhauster configured to exhaust the atmosphere inside the process chamber 201. In the exhaust pipe 231, a vacuum pump 246 serving as a vacuum exhaust device is connected through a pressure sensor 245 serving as a pressure detector (pressure detection section), which detects a pressure in the process chamber 201, and an auto pressure controller (APC) valve 244 serving as an exhaust valve (pressure regulation section). The APC valve 244 is a valve configured to perform a vacuum exhaust or a vacuum exhaust stop with respect to the process chamber 201 by opening or closing the valve while the vacuum pump 246 is operating, and to regulate the pressure in the process chamber 201 by adjusting the degree of valve opening based on pressure information detected by the pressure sensor 245 while the vacuum pump 246 is operating. An exhaust system (exhauster) is mainly configured by the exhaust pipe 231, the APC valve 244, and the pressure sensor 245. The vacuum pump 246 may be included in the exhaust system. The exhaust pipe 231 is not limited to the installation in the reaction tube 203. Similar to the nozzles 249a, 249b, and 249c, the exhaust pipe 231 may be provided in the manifold 209.

Under the manifold 209, a seal cap 219 is provided as a furnace throat lid that can airtightly close the lower end opening of the manifold 209. The seal cap 219 is configured to abut against the lower end of the manifold 209 from the lower side in the vertical direction. The seal cap 219 is made of a metal such as stainless steel (SUS) and is formed in a disk shape. On the top surface of the seal cap 219, an O-ring 220b is provided as a seal member that abuts against the lower end of the manifold 209. A rotation mechanism 267 that rotates a boat 217 to be described later is provided at the side of the seal cap 219 opposite to the process chamber 201. A rotational shaft 255 of the rotation mechanism 267 passes through the seal cap 219 and is connected to the boat 217. The rotation mechanism 267 is configured to rotate the wafers 200 by rotating the boat 217. The seal cap 219 is configured such that the seal cap 219 is moved upward and downward by a boat elevator 115 serving as an elevation mechanism that is vertically provided outside the reaction tube 203. The boat elevator 115 is configured to load the boat 217 into the process chamber 201 or unload the boat 217 from the process chamber 201 by moving the seal cap 219 upward or downward. The boat elevator 115 is configured as a transfer device (transfer mechanism) that transfers the boat 217, that is, the wafers 200, to the inside or the outside of the process chamber 201. In addition, under the manifold 209, a shutter 219s is provided as a furnace throat lid that can airtightly close the lower end opening of the manifold 209 while the seal cap 219 is moved downward by the boat elevator 115. The shutter 219s is made of a metal such as stainless steel (SUS) and is formed in a disk shape. On the top surface of the shutter 219s, an O-ring 220c is provided as a seal member that abuts against the lower end of the manifold 209. The opening and closing operation (the upward and downward moving operation, the rotating operation, or the like) of the shutter 219s is controlled by a shutter opening/closing mechanism 115s.

As illustrated in FIG. 1, the boat 217 serving as a substrate support is configured such that a plurality of sheets, for example, 25 to 200 of wafers 200, are vertically aligned and supported in a horizontal posture, with their centers aligned with one another, in multiple stages, that is, arranged spaced apart from one another at predetermined intervals. The boat 217 is made of, for example, a heat resistant material such as quartz or SiC. Under the boat 217, a heat insulating plate 218, which is made of, for example, a heat resistant material such as quartz or SiC, is configured to be supported in multiple stages.

As illustrated in FIG. 2, a temperature sensor 263 serving as a temperature detector is installed in the reaction tube 203. An amount of current to be supplied to the heater 207 is adjusted based on temperature information detected by the temperature sensor 263, such that the temperature in the process chamber 201 has a desired temperature distribution. Similarly to the nozzles 249a, 249b, and 249c, the temperature sensor 263 is provided along the inner wall of the reaction tube 203.

Figure 3:
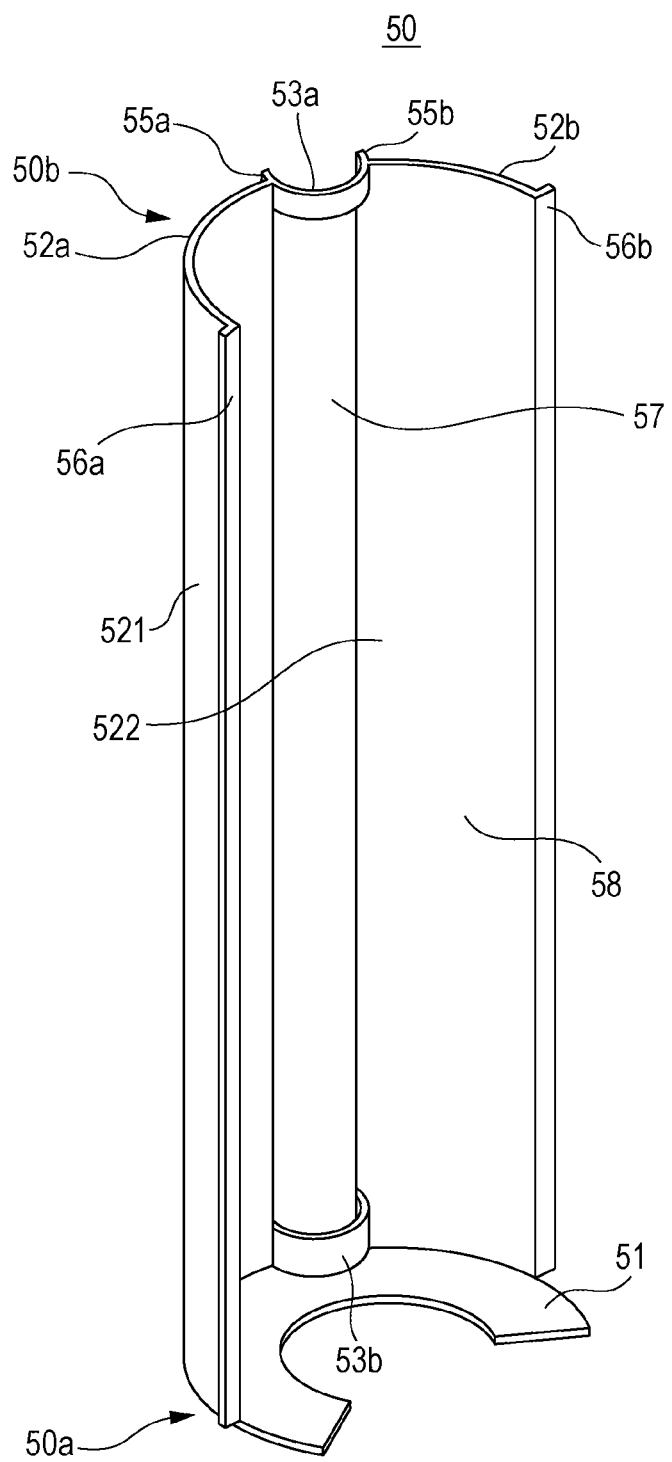
FIG. 3 is a perspective view for describing a gas rectifier suitably used in the embodiment of the present disclosure.
Figure 4:
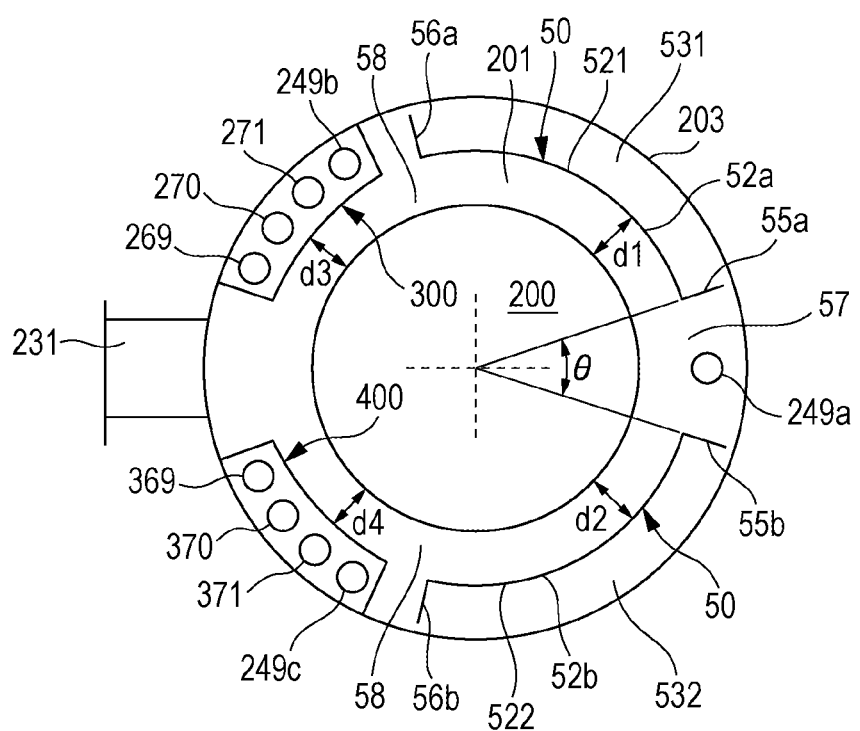
FIG. 4 is a schematic diagram for describing a process furnace portion provided with the gas rectifier in FIG. 3 and a sectional view taken along line A-A of FIG. 1.
Figure 5:
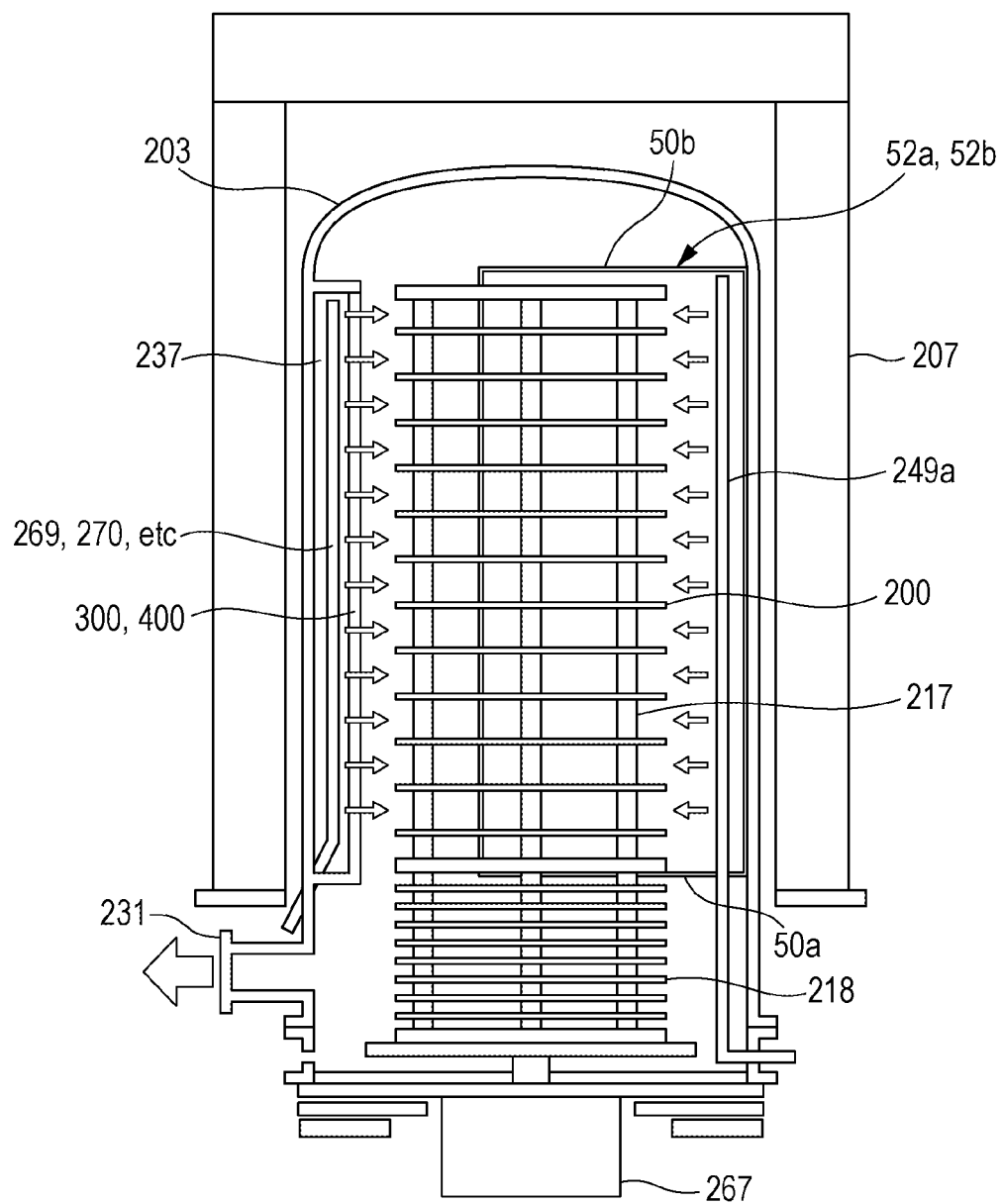
FIG. 5 is a schematic longitudinal sectional view of a reaction tube portion for describing a relationship between the gas rectifier and a wafer loaded into a boat.

The configuration of the gas rectifier 50 installed in the reaction tube 203 will be described with reference to FIGS. 3, 4, and 5. FIG. 3 is a perspective view of the gas rectifier 50. FIG. 4 is a schematic diagram for describing a state in which the gas rectifier 50 in FIG. 3 is installed in the reaction tube 203 and a sectional view taken along line A-A of FIG. 1. FIG. 5 is a schematic longitudinal sectional view of the reaction tube portion for describing a relationship between the gas rectifier 50 and the wafers 200 loaded into the boat 217.

The gas rectifier 50 can be also regarded as a reaction tube wall or a rectifying wall provided in the reaction tube 203. In film-forming steps (S3, S4, S5, and S6) to be described later, the gas rectifier 50 is provided in the reaction tube 203 so as to rectify the flow of the reactant gas and the precursor gas in the reaction tube 203.

The gas rectifier 50 includes a C-shaped lower plate member 51, a pair of partition members (partition plates) 521 and 522, and a pair of arc-shaped connecting members 53a and 53b that connect the upper and lower ends of the pair of partition members 521 and 522, and these are all formed of transparent quartz and connected by welding. When the gas rectifier 50 is made of quartz, the following advantages can be obtained. Due to the transparent member, heat rays (light rays having high heat, such as infrared rays) are not blocked. Since the characteristics such as the coefficient of thermal expansion or the thermal conductivity are the same as those of other components such as the reaction tube 203, it is easy to control the influence of heat. High heat resistance can be obtained. Furthermore, the permeability of heat rays in the partition members 521 and 522 can be improved by providing spaces 531 and 532 between the partition members 521 and 522 and the reaction tube 203. That is, the heat rays from the heater 207 can be supplied to the substrate 200 without being attenuated. Preferably, the partition members 521 and 522 have the same thickness as the wall of the buffer structure 300. Due to the configuration having such a thickness, it is possible to suppress unevenness in the supply amount of the heat rays from the circumferential direction of the substrate 200. The partition member 521 can be referred to as a first partition member and the partition member 522 can be referred to as a second partition member.

The pair of partition members 521 and 522 are provided along the outer circumference of the C-shaped lower plate member 51, and have central partition members 52a and 52b each having an arcuate curved plate shape whose length is substantially equal to the total height of the boat 217. The pair of partition members 521 and 522 are also provided concentrically with the wafers 200 loaded into the boat 217. At both ends of the central partition member 52a of the partition member 521 in the circumferential direction, the first plate member 55a and the second plate member 56a are provided with the same length as the length of the central partition member 52a. The first plate member 55a and the second plate member 56a extend in an outer direction of the gas rectifier 50 (in a direction toward the inner wall of the reaction tube 203) and are located within the reaction tube 203 to the extent that the first plate member 55a and the second plate member 56a do not contact the inner wall of the reaction tube 203. By providing the first plate member 55a and the second plate member 56a so as not to contact the inner wall of the reaction tube 203, a gap (space) can be formed between the partition member 521 and the inner wall of the reaction tube 203. Even if various gases enter the space between the partition member 521 and the inner wall of the reaction tube 203, the gas that has entered through this gap can be exhausted and the retention of the gas in the reaction tube 203 can be suppressed. In the reaction tube 203, the first plate member 55a is provided on the nozzle 249a side, and the second plate member 56a is provided on the nozzle 249b side.

Similarly, at both ends of the central partition member 52b of the partition member 522 in the circumferential direction, a first plate member (also referred to as a third plate member) 55b and a second plate member (also referred to as a fourth plate member) 56b are provided with the same length as the central partition member 52b. The first plate member 55b and the second plate member 56b extend in the outer direction of the gas rectifier 50 (in the direction of the inner wall of the reaction tube 203) and are located within the reaction tube 203 to the extent that the first plate member 55b and the second plate member 56b do not contact the inner wall of the reaction tube 203. By providing the first plate member 55b and the second plate member 56b so as not to contact the inner wall of the reaction tube 203, a gap (space) can be formed between the partition member 522 and the inner wall of the reaction tube 203. Even if various gases enter the space between the partition member 522 and the inner wall of the reaction tube 203, the gas that has entered through this gap can be exhausted and the retention of the gas in the reaction tube 203 can be suppressed. In the reaction tube 203, the first plate member 55b is provided on the nozzle 249a side, and the second plate member 56b is provided on the nozzle 249c side.

The first plate member 55a and the second plate member 56a may be configured to contact the inner wall of the reaction tube 203. In addition, similarly, the first plate member 55b and the second plate member 56b may be configured to contact the inner wall of the reaction tube 203. By configuring the first plate member and the second plate member to contact the inner wall of the reaction tube 203, it is possible to prevent various gases from entering between the partition members 521 and 522 and the reaction tube 203.

Openings 57 are provided between the central partition members 52a and 52b (or the first plate members 55a and 55b) and the pair of connecting members 53a and 53b, and the gas pipe 249a can be installed so as to be positioned between the openings 57. Furthermore, openings 58 are provided between the central partition members 52a and 52b (or the second plate members 56a and 56b). The opening 58 is provided on the exhaust pipe 231 side with respect to the opening 57 in the reaction tube 203. That is, the gas rectifier 50 is provided in the reaction tube 203 other than the position where the nozzle 249a serving as the precursor gas supply section and the buffer structures 300 and 400 provided with the nozzles 249b and 249c serving as the reactant gas supply section are disposed.

The opening 57 and the opening 58 are provided such that the precursor gas from the nozzle 249a passes over the surface of the wafer 200 loaded into the boat 217 and is efficiently exhausted from the exhaust pipe 231. In addition, the opening 57 and the opening 58 are provided such that the reactant gas from the nozzles 249b and 249c passes over the surface of the wafer 200 loaded into the boat 217 and is efficiently exhausted from the exhaust pipe 231.

Both the lower end portion 50a and the upper end portion 50b of the gas rectifier 50 are configured to be opened such that the precursor gas and the reactant gas do not stagnate. The partition members 521 and 522 are provided in the region where the wafers 200 loaded into the boat 217 exist. The gas rectifier 50 is provided to cover the side surfaces of the plurality of wafers 200 loaded into the boat 217 at positions other than the position where the nozzle 249a serving as the precursor gas supply section and the buffer structures 300 and 400 (or the buffer chamber 237) serving as the reactant gas supply section are disposed. That is, the lower portions of the partition members 521 and 522 located at the lower end portion 50a of the gas rectifier 50 are above the region where the heat insulating plate 218 is provided, and the upper portions of the partition members 521 and 522 located at the upper end portion 50b of the gas rectifier 50 are located above the wafers 200 loaded into the boat 217. In addition, the lower portions of the partition members 521 and 522 located at the lower end portion 50a of the gas rectifier 50 are configured to cover the heat insulating plate 218.

The gas rectifier 50 is installed in the reaction tube 203 such that the interval (distance) between the inner walls of the central partition members 52a and 52b and the outer circumferential portion (edge portion or side surface portion) of the wafer 200 in the reaction tube 203 is substantially the same as the interval (distance) between the inner walls of the buffer structures 300 and 400 (the wall surface facing the wafer 200) and the outer circumferential portion of the wafer 200 in the reaction tube 203.

That is, when a distance between the central partition member 52a and the outer circumferential portion of the wafer 200 is a distance d1, a distance between the central partition member 52b and the outer circumferential portion of the wafer 200 is a distance d2, a distance between the inner wall of the buffer structure 300 and the outer circumferential portion of the wafer 200 in the reaction tube 203 is a distance d3, and a distance between the inner wall of the buffer structure 400 and the outer circumferential portion of the wafer 200 in the reaction tube 203 is a distance d4, the intervals d1, d2, d3, and d4 are set to substantially the same value. The intervals d1, d2, d3, and d4 are set to constant distances. That is, the first partition member 521 is disposed at a position of a certain distance (d1) from the edge portion of the substrate 200 along the inner wall of the reaction tube 203 between the precursor gas supply section (249a) and the first plasma generator (269, 270, 271). Similarly, the second partition member 522 is disposed at a position of a certain distance (d2) from the outer circumferential portion of the substrate 200 along the inner wall of the reaction tube 203 between the precursor gas supply section (249a) and the second plasma generator (369, 370, 371).

An opening degree θ between the first plate member 55a of the partition member 521 provided on the nozzle 249a side and the first plate member 55b of the partition member 522 (an angle formed by a line segment connecting the center of the substrate 200 and the first plate member 55a of the partition member 521 and a line segment connecting the center of the substrate 200 and the first plate member 55b of the partition member 522) is configured to be 10 degrees or more and 30 degrees or less. When the opening degree θ exceeds 30 degrees, the gas diffuses around the substrate 200, and the supply amount to the center of the substrate 200 decreases. In addition, when the opening degree θ is less than 10 degrees, the supply amount to the center of the substrate 200 increases, and the supply amount to the circumference of the substrate 200 decreases.

By providing the gas rectifier 50 in the reaction tube 203, the flow of the reactant gas and the precursor gas is rectified, and the reactant gas and the precursor gas are efficiently supplied to the wafers 200 loaded into the boat 217. The rectification of the flow of the reactant gas and the precursor gas will be described later in detail.

The reaction tube 203 has a cylindrical shape so as to withstand pressure reduction. By providing the gas rectifier 50 in the reaction tube 203, the plate thickness of the heat-resistant material such as quartz or SiC constituting the reaction tube 203 can be reduced, and it is possible to make the reaction tube 203 light and easy to manufacture.

Figure 6:
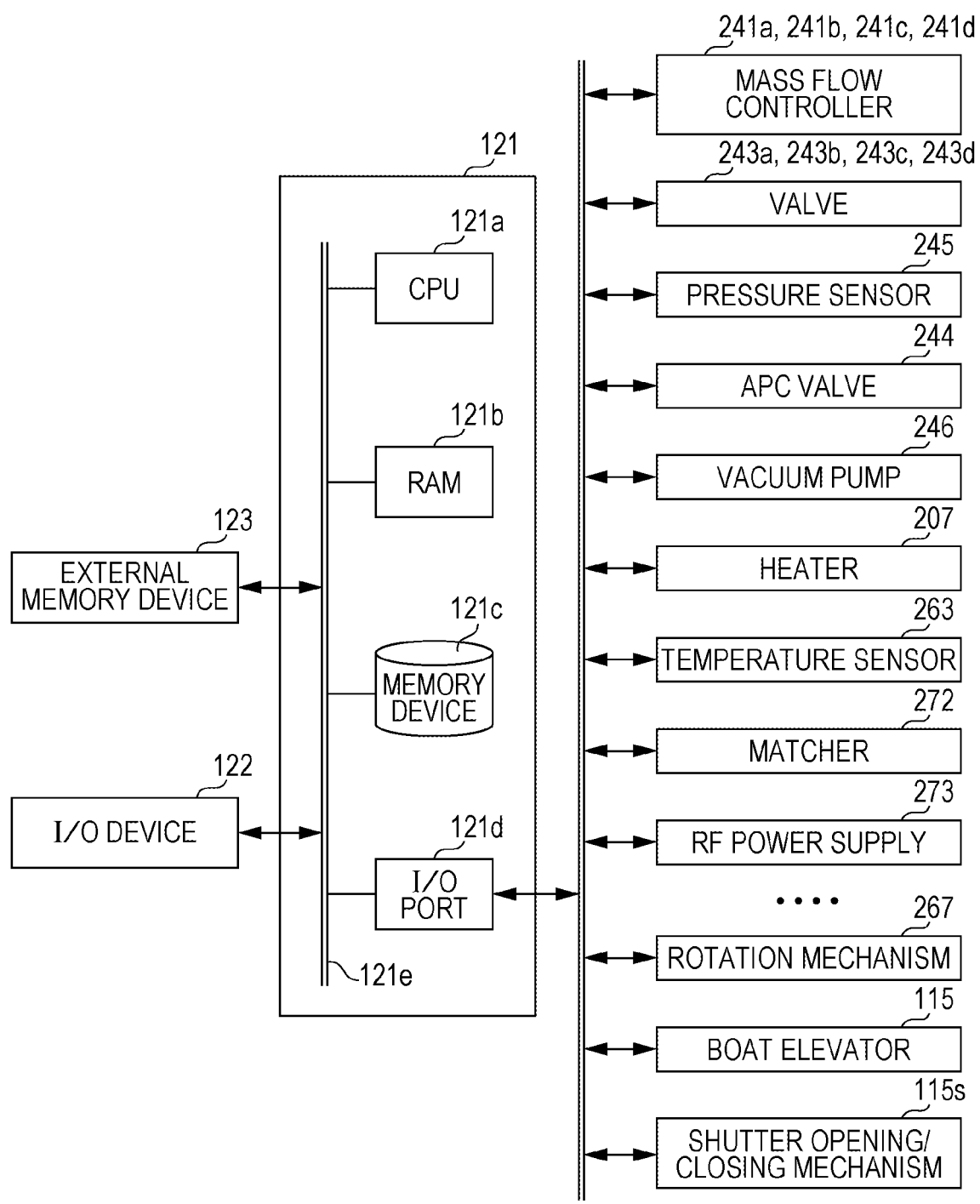
FIG. 6 is a schematic configuration diagram of a controller of the substrate processing apparatus suitably used in the embodiment of the present disclosure and a block diagram of a control system of the controller.

Next, a control device will be described with reference to FIG. 6. As illustrated in FIG. 6, a controller 121 serving as a control section (control device) is configured by a computer that includes a central processing unit (CPU) 121a, a random access memory (RAM) 121b, a memory device 121c, and an input/output (I/O) port 121d. The RAM 121b, the memory device 121c, and the I/O port 121d are configured to exchange data with the CPU 121a through an internal bus 121e. An I/O device 122 that is configured as, for example, a touch panel or the like, is connected to the controller 121.

The memory device 121c is configured by, for example, a flash memory, a hard disk drive (HDD), or the like. In the memory device 121c, a control program for controlling an operation of a substrate processing apparatus or a process recipe describing procedures or conditions of a film-forming process of substrate processing to be described later is stored to be readable. The process recipe is a combination of sequences of various processes (film-forming process) to be described later so as to obtain a desired result when the processes are performed by the controller 121, and functions as a program. Hereinafter, the process recipe, the control program, and the like will be simply and collectively referred to as a program. In addition, the process recipe is simply referred to as a recipe. When the term "program" is used in the present specification, it may be understood as including a recipe alone, a control program alone, or both of the recipe and the control program. The RAM 121b is configured as a memory area (work area) in which a program or data read by the CPU 121a is temporarily retained.

The I/O port 121d is connected to the MFCs 241a to 241d, the valves 243a to 243d, the pressure sensor 245, the APC valve 244, the vacuum pump 246, the heater 207, the temperature sensor 263, the matchers 272 and 372, the RF power supplies 273 and 373, the rotation mechanism 267, the boat elevator 115, the shutter opening/closing mechanism 115s, and the like.

The CPU 121a is configured to read and execute the control program from the memory device 121c and to read the recipe from the memory device 121c according to an input of an operation command from the I/O device 122, or the like. According to the contents of the read recipe, the CPU 121a is configured to control the operation of controlling the rotation mechanism 267, the operation of adjusting the flow rates of various gases by the MFCs 241a to 241d, the operation of opening and closing the valves 243a to 243d, the operation of adjusting the RF power supplies 273 and 373 based on the impedance monitoring, the operation of opening and closing the APC valve 244, the operation of adjusting the pressure by the APC valve 244 based on the pressure sensor 245, the start and stop of the vacuum pump 246, the operation of adjusting the temperature of the heater 207 based on the temperature sensor 263, the operation of adjusting the forward and backward rotation, the rotation angle, and the rotation speed of the boat 217 by the rotation mechanism 267, and the operation of moving the boat 217 upward and downward by the boat elevator 115.

The controller 121 can be configured by installing, on a computer, the program stored in an external memory device (for example, a magnetic disk such as a hard disk, an optical disk such as a CD, a magneto-optical disk such as an MO, or a semiconductor memory such as a USB memory) 123. The memory device 121c or the external memory device 123 is configured as a non-transitory computer-readable recording medium. Hereinafter, the memory device 121c and the external memory device 123 may be simply and collectively referred to as a recording medium. When the term "recording medium" is used in the present specification, it may be understood as including the memory device 121c alone, the external memory device 123 alone, or both of the memory device 121c and the external memory device 123. The provision of the program to the computer may be performed by using a communication device, such as the Internet or dedicated lines, without using the external memory device 123.

Figure 7:
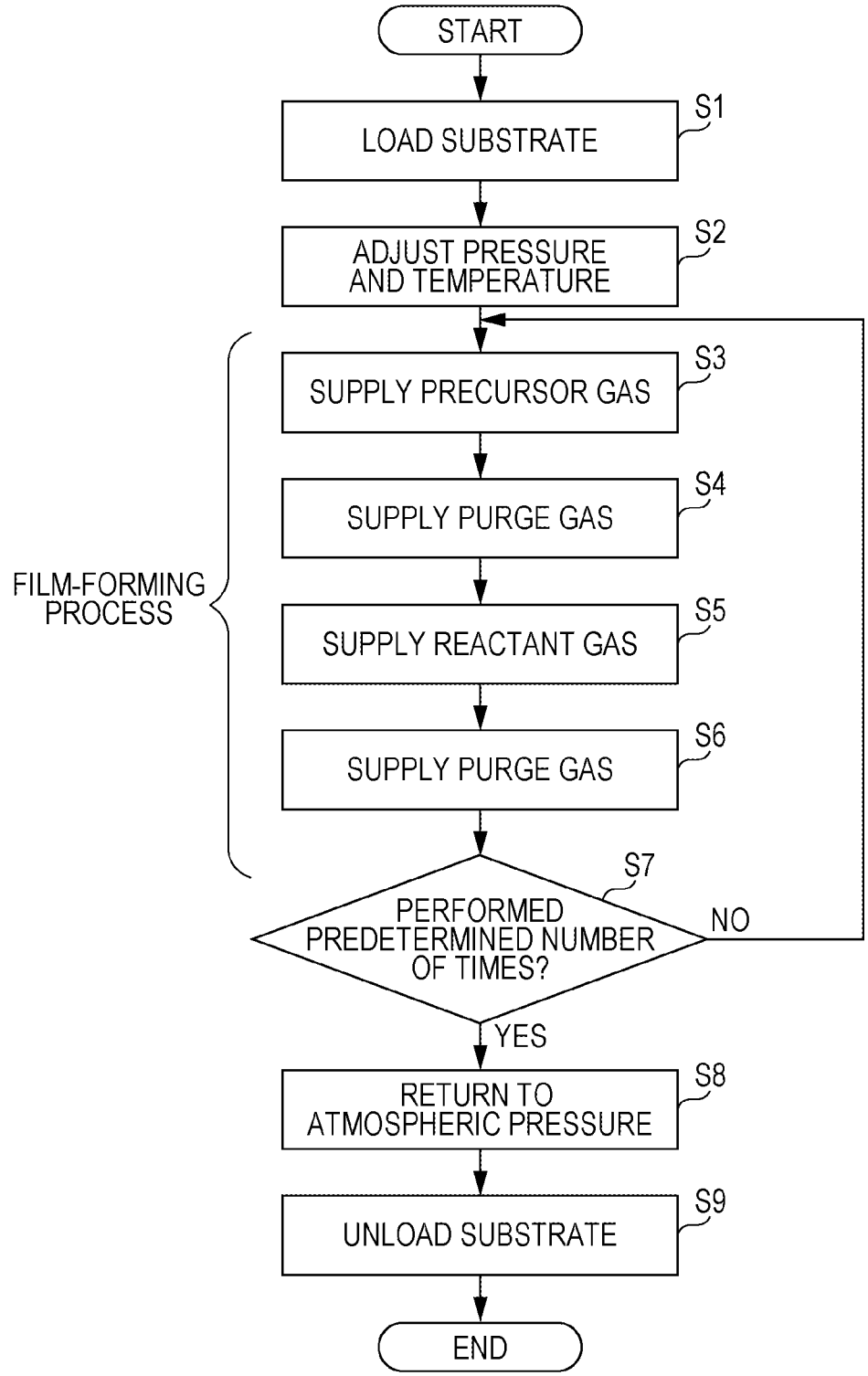
FIG. 7 is a flowchart of a substrate processing process according to an embodiment of the present disclosure.
Figure 8:
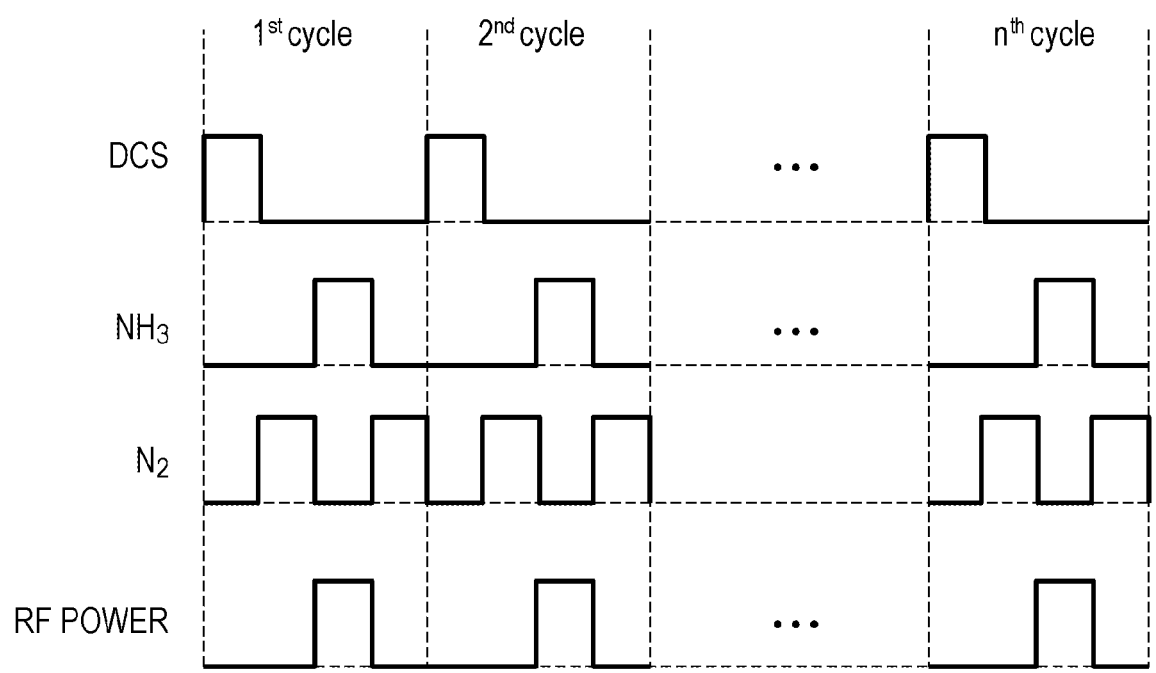
FIG. 8 is a diagram illustrating a gas supply timing in the substrate processing process according to an embodiment of the present disclosure.

Next, as one of the processes of manufacturing a semiconductor device, a process of forming a thin film on a wafer 200 by using the substrate processing apparatus will be described with reference to FIGS. 7 and 8. In the following description, the operations of the respective elements constituting the substrate processing apparatus are controlled by the controller 121.

The following description will be given of an example of forming a silicon nitride film (SiN film) as a film containing Si and N on a wafer 200 by performing supplying a DCS gas as a precursor gas and supplying a plasma-excited NH$_3$ gas as a reactant gas non-simultaneously, that is, without synchronization, a predetermined number of times (once or more). Also, for example, a predetermined film may be formed in advance on the wafer 200. In addition, a predetermined pattern may be formed in advance on the wafer 200 or the predetermined film.

In the present disclosure, for convenience, the process flow of the film-forming process illustrated in FIG. 8 may be represented as follows. In the following descriptions of other embodiments, the same notation is used.

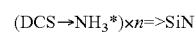

(DCS→NH$_3$*)×n=>SiN

When the term "wafer" is used in the present specification, it may be understood as a wafer itself, or a laminate of a wafer and a predetermined layer or film formed on a surface thereof. When the term "a surface of a wafer" is used in the present specification, it may be understood as a surface of a wafer itself or a surface of a predetermined layer or the like formed on a wafer. When the expression "a predetermined layer is formed on a wafer" is used in the present specification, it may be understood to mean that a predetermined layer is directly formed on a surface of a wafer itself or mean that a predetermined layer is formed on a layer or the like formed on a wafer." A case in which the term "substrate" is used in the present specification is synonymous with the case in which the term "wafer" is used.

When a plurality of sheets of wafers 200 are charged into the boat 217 (wafer charging), the shutter 219s is moved by the shutter opening/closing mechanism 115s and the lower end opening of the manifold 209 is opened (shutter opening). After that, as illustrated in FIG. 1, the boat 217 that supports the plurality of sheets of wafers 200 is lifted by the boat elevator 115 and is loaded into the process chamber 201 (boat loading). In this state, the seal cap 219 seals the lower end of the manifold 209 through the O-ring 220b.

The inside of the process chamber 201, that is, the space where the wafers 200 are present, is vacuum-exhausted (exhausted under reduced pressure) to have a desired pressure (degree of vacuum) by the vacuum pump 246. In this case, the pressure in the process chamber 201 is measured by the pressure sensor 245, and the APC valve 244 is feedback-controlled based on information about the measured pressure. The vacuum pump 246 maintains a full-time operating state at least until the completion of a film-forming step to be described later.

In addition, the wafers 200 in the process chamber 201 are heated by the heater 207 such that the wafers 200 have a desired temperature. In this case, an amount of current supplied to the heater 207 is feedback-controlled based on the temperature information detected by the temperature sensor 263, such that the inside of the process chamber 201 has a desired temperature distribution. The heating of the inside of the process chamber 201 by the heater 207 is continuously performed at least until the completion of the film-forming step to be described later. However, in a case in which the film-forming step is performed under a temperature condition of room temperature or less, the inside of the process chamber 201 may not be heated by the heater 207. Incidentally, in a case in which the processing under such temperature is performed alone, the heater 207 is not provided and the heater 207 may not be installed in the substrate processing apparatus. In this case, the configuration of the substrate processing apparatus can be simplified.

Subsequently, the rotation of the boat 217 and the wafers 200 is started by the rotation mechanism 267. The rotation of the boat 217 and the wafers 200 by the rotation mechanism 267 is continuously performed at least until the completion of the film-forming step.

After that, a film-forming step is executed by sequentially performing steps S3, S4, S5, and S6.

In step S3, a DCS gas is supplied to the wafers 200 in the process chamber 201.

The valve 243a is opened and the DCS gas flows into the gas supply pipe 232a. The DCS gas, the flow rate of which is controlled by the MFC 241a, is supplied from the gas supply hole 250a into the process chamber 201 through the nozzle 249a and is exhausted from the exhaust pipe 231. At this time, the valve 243c is opened at the same time such that an $N_2$ gas flows into the gas supply pipe 232c. The flow rate of the $N_2$ gas is adjusted by the MFC 241c, and the $N_2$ gas is supplied into the process chamber 201 together with the DCS gas and is exhausted from the exhaust pipe 231.

In addition, in order to suppress the intrusion of the DCS gas into the nozzles 249b and 249c, the valve 243d is opened so that the $N_2$ gas flows into the gas supply pipe 232d. The $N_2$ gas is supplied to the process chamber 201 through the gas supply pipe 232b and the nozzles 249b and 249c and is exhausted from the exhaust pipe 231.

The supply flow rate of the DCS gas, which is controlled by the MFC 241a, is set to a flow rate within a range of, for example, 1 sccm to 6,000 sccm, and preferably 2,000 sccm to 3,000 sccm. The supply flow rates of the $N_2$ gases, which are controlled by the MFCs 241c and 241d, are respectively set to a flow rate within a range of, for example, 100 sccm to 10,000 sccm. The pressure in the process chamber 201 is set to a pressure within a range of, for example, 1 Pa to 2,666 Pa, and preferably 665 Pa to 1,333 Pa. The time to expose the wafers 200 to the DCS gas is set to a time within a range of, for example, 1 second to 10 seconds, and preferably 1 second to 3 seconds.

The temperature of the heater 207 is set such that the temperature of the wafers 200 is set to a temperature within a range of, for example, 0° C. to 700° C., preferably room temperature (25° C.) to 550° C., and more preferably 40° C. to 500° C. As in the present embodiment, by setting the temperature of the wafer 200 to 700° C. or less, preferably 550° C. or less, and more preferably 500° C. or less, it is possible to reduce an amount of heat applied to the wafer 200 and to satisfactorily perform the control of heat history experienced by the wafer 200.

By supplying the DCS gas to the wafer 200 under the above-described condition, the Si-containing layer is formed on the wafer 200 (surface base film). The Si-containing layer may include, in addition to the Si layer, Cl or H. The Si-containing layer is formed on the outermost surface of the wafer 200 by the physical adsorption of the DCS, the chemical adsorption of the material obtained by partial decomposing of the DCS, the deposition of Si obtained by thermal decomposition of the DCS, and the like. That is, the Si-containing layer may be an adsorption layer (physical adsorption layer or chemical adsorption layer) of DCS or a material obtained by partial decomposing of the DCS, or may be a Si deposited layer (Si layer).

After the Si-containing layer is formed, the valve 243a is closed and the supply of the DCS gas to the process chamber 201 is stopped. At this time, the APC valve 244 is kept open, and the inside of the process chamber 201 is vacuum-exhausted by the vacuum pump 246. The unreacted DCS gas remaining in the process chamber 201, the DCS gas remaining after contributing to the formation of the Si-containing layer, the reaction by-product, and the like are exhausted from the process chamber 201 (S4). In addition, the valves 243c and 243d are kept open, and the supply of the $N_2$ gas to the process chamber 201 is maintained. The $N_2$ gas acts as a purge gas. This step S4 may be omitted.

As the precursor gas, besides the DCS gas, various aminosilane precursor gases such as tetrakisdimethylaminosilane ($Si[N(CH_3)_2]_4$, 4DMAS) gas, trisdimethylaminosilane ($Si[N(CH_3)_2]_3H$, 3DMAS) gas, bisdimethylamisilane ($Si[N(CH_3)_2]_2H_2$, BDMAS) gas, bisdiethylaminosilane ($Si[N(C_2H_5)_2]_2H_2$, BDEAS), bistertiarybutylaminosilane ($SiH_2[NH(C_4H_9)]_2$, BTBAS) gas, dimethylaminosilane (DMAS) gas, diethylaminosilane (DEAS) gas, dipropylaminosilane (DPAS) gas, diisopropylaminosilane (DIPAS) gas, butylaminosilane (BAS) gas, and hexamethyldisilazane (HMDS) gas, inorganic halosilane precursor gases such as monochlorosilane ($SiH_3Cl$, MCS) gas, trichlorosilane ($SiHCl_3$, TCS) gas, tetrachlorosilane ($SiCl_4$, STC) gas, hexachlorodisilane ($Si_2Cl_6$, HCDS) gas, and octachlorotrisilane ($Si_3Cl_8$, OCTS) gas, or halogen group-free inorganic silane precursor gases such as monosilane ($SiH_4$, MS) gas, disilane ($Si_2H_6$, DS) gas, and trisilane ($Si_3H_8$, TS) gas can be suitably used.

As the inert gas, in addition to the $N_2$ gas, a rare gas, such as an Ar gas, a He gas, a Ne gas, or a Xe gas, can be used.

After the film-forming process is completed, a plasma-excited $NH_3$ gas as a reactant gas is supplied to the wafer 200 in the process chamber 201 (S5).

In this step, the opening and closing control of the valves 243b to 243d are performed in the same procedure as the opening and closing control of the valves 243a, 243c, and 243d in step S3. The $NH_3$ gas, the flow rate of which is controlled by the MFC 241b, is supplied into the buffer chamber 237 through the nozzles 249b and 249c. At this time, RF power is supplied between the rod-shaped electrodes 269, 270, 271, 369, 370, and 371. The $NH_3$ gas supplied into the buffer chamber 237 is excited to a plasma state (plasma-activated), is supplied into the process chamber 201 as an active species ($NH_3$*), and is exhausted from the exhaust pipe 231.

The supply flow rate of the $NH_3$ gas, which is controlled by the MFC 241b, is set to a flow rate within a range of, for example, 100 sccm to 10,000 sccm, and preferably 1,000 sccm to 2,000 sccm. The RF power, which is applied to the rod-shaped electrodes 269, 270, 271, 369, 370, and 371, is set to be power in a range within, for example, 50 W to 600 W. The pressure in the process chamber 201 is set to be a pressure within a range of, for example, 1 Pa to 500 Pa. By the use of the plasma, the $NH_3$ gas can be activated even when the pressure in the process chamber 201 is set to be such a relatively low pressure zone. The time to supply the active species, which is obtained by plasma-exciting the $NH_3$ gas, to the wafer 200, that is, the gas supply time (irradiation time), is set to be a time within a range of, for example, 1 second to 180 seconds, and preferably 1 second to 60 seconds. The other process conditions are the same as the process conditions in step S3.

By supplying the $NH_3$ gas to the wafer 200 under the above-described condition, the Si-containing layer formed on the wafer 200 is plasma-nitrided. At this time, due to the energy of the plasma-excited $NH_3$ gas, a Si—Cl bond and a Si—H bond included in the Si-containing layer are broken. Cl and H separated from the bond with Si are desorbed from the Si-containing layer. Si of the Si-containing layer that has a dangling bond due to the desorption of Cl or the like is bonded to N included in the $NH_3$ gas, and the Si—N bond is formed. Due to the progress of this reaction, the Si-containing layer is changed (reformed) into a layer including Si and N, that is, a silicon nitride layer (SiN layer).

In order to reform the Si-containing layer into the SiN layer, it is preferable to plasma-excite an $NH_3$ gas and supply the plasma-excited $NH_3$ gas. This is because, in the above-described temperature zone, even if the $NH_3$ gas is supplied under non-plasma atmosphere, energy necessary for nitriding the Si-containing layer is insufficient and it is difficult to increase a Si—N bond by sufficiently desorbing Cl or H from the Si-containing layer or sufficiently nitriding the Si-containing layer.

After the Si-containing layer is changed to the SiN layer, the valve 243b is closed to stop the supply of the $NH_3$ gas. In addition, the supply of RF power between the rod-shaped electrodes 269, 270, 271, 369, 370, and 371 is stopped. Then, the $NH_3$ gas or the reaction by-product remaining in the process chamber 201 is removed from the process chamber 201 according to the same processing procedures and processing conditions as those in step S4 (S6). This step S6 may be omitted.

In addition to the $NH_3$ gas, diazene ($N_2H_2$) gas, hydrazine ($N_2H_4$) gas, $N_3H_8$ gas, or the like may be used as a nitriding agent, that is, the plasma-excited $NH_3$-containing gas.

In addition to the $N_2$ gas, for example, various rare gases exemplified in step S4 can be used as the inert gas.

A SiN film having a predetermined composition and a predetermined film thickness can be formed on the wafer 200 by performing a cycle a predetermined number of times (n times), that is, once or more (S7), the cycle including non-simultaneously performing the above-described S3, S4, S5, and S6 in this order, that is, without synchronization. The above-described cycle is preferably performed twice or more. That is, it is preferable that the thickness of the SiN layer to be formed per a cycle may be set to be less than a desired thickness and the above-described cycle may be performed twice or more until the film thickness of the SiN film formed by laminating the SiN layers becomes a desired thickness.

When the above-described film-forming process is completed, an $N_2$ gas as an inert gas is supplied from each of the gas supply pipes 232c and 232d into the process chamber 201 and is exhausted from the exhaust pipe 231. Therefore, the inside of the process chamber 201 is purged with the inert gas, so that the gas or the like remaining in the process chamber 201 is removed from the process chamber 201 (inert gas purging). After that, the atmosphere in the process chamber 201 is replaced with the inert gas (inert gas replacement) and the pressure in the process chamber 201 is returned to the normal pressure (S8).

After that, the seal cap 219 is moved downward by the boat elevator 115. Thus, the lower end of the manifold 209 is opened and the processed wafers 200 are unloaded from the lower end of the manifold 209 to the outside of the reaction tube 203 in a state in which the processed wafers 200 are supported to the boat 217 (boat unloading) (S9). After the boat unloading, the shutter 219s is moved and the lower end of the manifold 209 is sealed through the O-ring 220c by the shutter 219s (shutter closing). After the processed wafers 200 are unloaded to the outside of the reaction tube 203, the processed wafers 200 are carried out from the boat 217 (wafer discharging). After the wafer discharging, the empty boat 217 may be loaded into the process chamber 201.

Hereinafter, the rectification of the precursor gas and the reactant gas by the gas rectifier 50 will be described with reference to FIGS. 9A to 9D and 10A to 10D. FIGS. 9A to 9D are conceptual diagrams for describing the flow of gas in the reaction tube 203 according to a comparative example and are diagrams for describing the gas flow in the reaction tube when the gas rectifier 50 is not provided in the reaction tube 203. FIGS. 10A to 10D are conceptual diagrams for describing the flow of gas in the reaction tube when the gas rectifier 50 according to the present embodiment is installed in the reaction tube 203. The flow of gas of the comparative example of FIGS. 9A to 9D will be first described and the flow of gas of the present embodiment of FIGS. 10A to 10D will be then described.

Figure 9A:
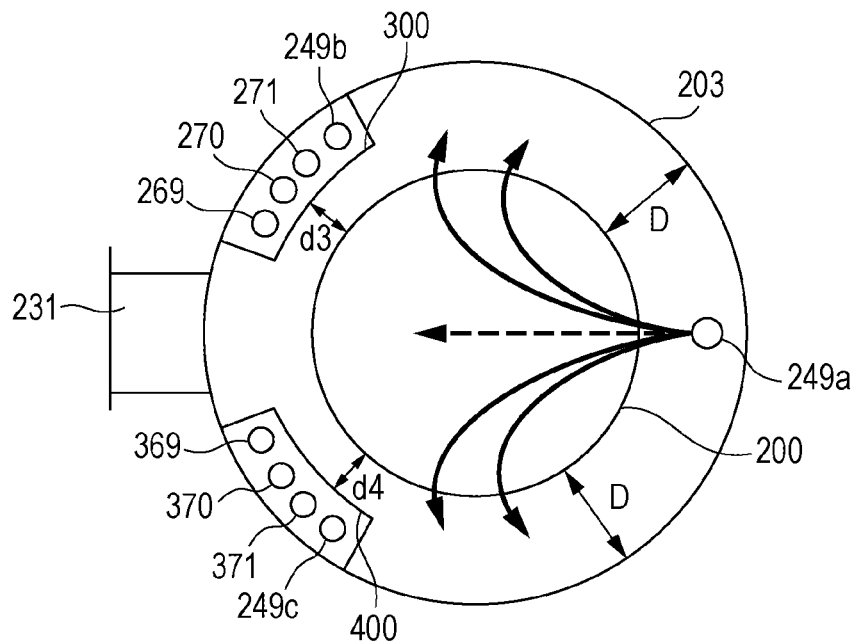
FIG. 9A is a top view illustrating a flow of a precursor gas on a surface of a wafer, according to a comparative example.
Figure 9B:
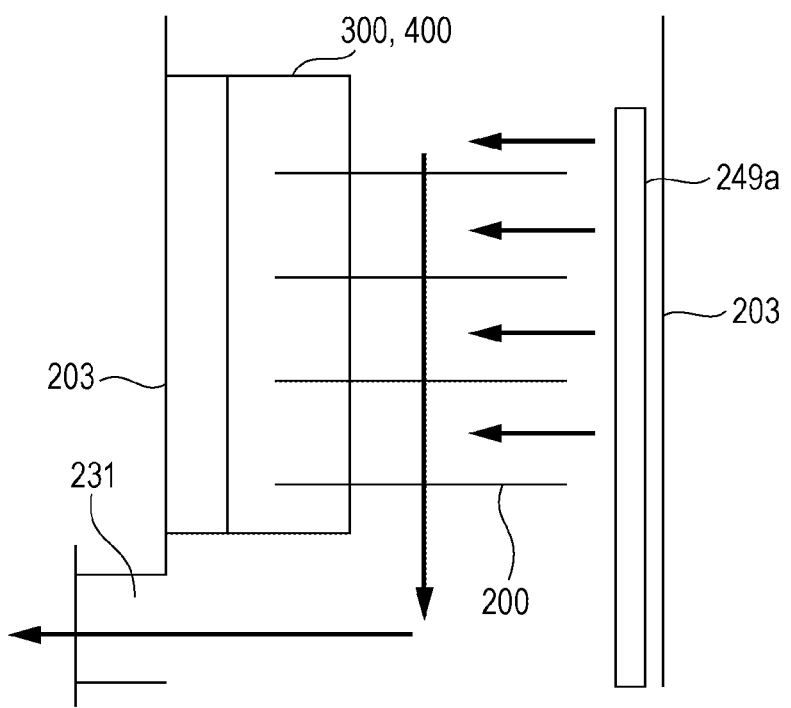
FIG. 9B is a partial longitudinal sectional view illustrating a flow of a precursor gas when a loaded wafer is viewed from the side, according to a comparative example.

FIGS. 9A and 9B illustrate the flow of the precursor gas when the precursor gas is supplied onto each wafer 200 from the gas supply hole 250a of the nozzle 249a. FIG. 9A is a top view illustrating the flow of the precursor gas on the surface of the wafer 200, and FIG. 9B is a partial longitudinal sectional view illustrating the flow of the precursor gas when the loaded wafer 200 is viewed from the side.

As illustrated in FIG. 9A, on the surface of the wafer 200, the flow (supply amount) of the precursor gas in the vicinity of the central portion of the wafer 200 indicated by the dashed arrow may be smaller than the flow (supply amount) of the precursor gas in the left-right direction of the wafer 200 indicated by the solid arrow. This is because the interval (distance) D between the inner wall of the reaction tube 203 and the outer circumference of the wafer 200 is wide as compared to the interval d3 between the inner wall of the buffer structure 300 and the outer circumference of the wafer 200 in the reaction tube 203 or the interval d4 between the inner wall of the buffer structure 400 and the outer circumference of the wafer 200 in the reaction tube 203. That is, since the distance D is D>d3 or d4, the precursor gas is likely to flow below the reaction tube 203 from a gap of the interval (distance) D between the inner wall of the reaction tube 203 and the outer circumference of the wafer 200.

As illustrated in FIG. 9B, the precursor gas is supplied to the surface of each wafer 200 from the gas supply hole 250a of the nozzle 249a, passes over the surface of each wafer 200, flows below the reaction tube 203 from a gap of the interval (distance) D between the inner wall of the reaction tube 203 and the outer circumference of the wafer 200, as indicated by the downward arrow in FIG. 9B, and is then exhausted from the exhaust pipe 231.

Figure 9C:
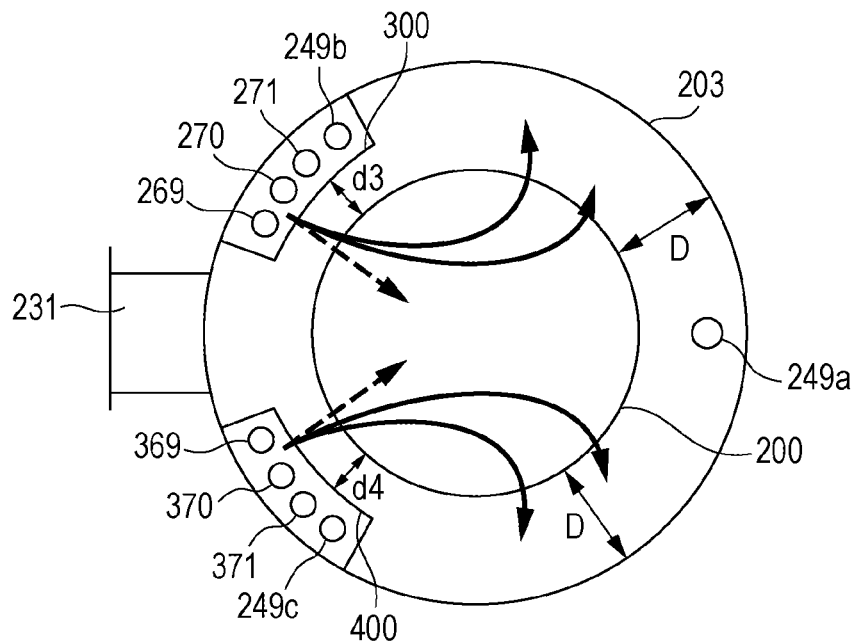
FIG. 9C is a top view illustrating a flow of an activated reactant gas on a surface of a wafer, according to a comparative example.
Figure 9D:
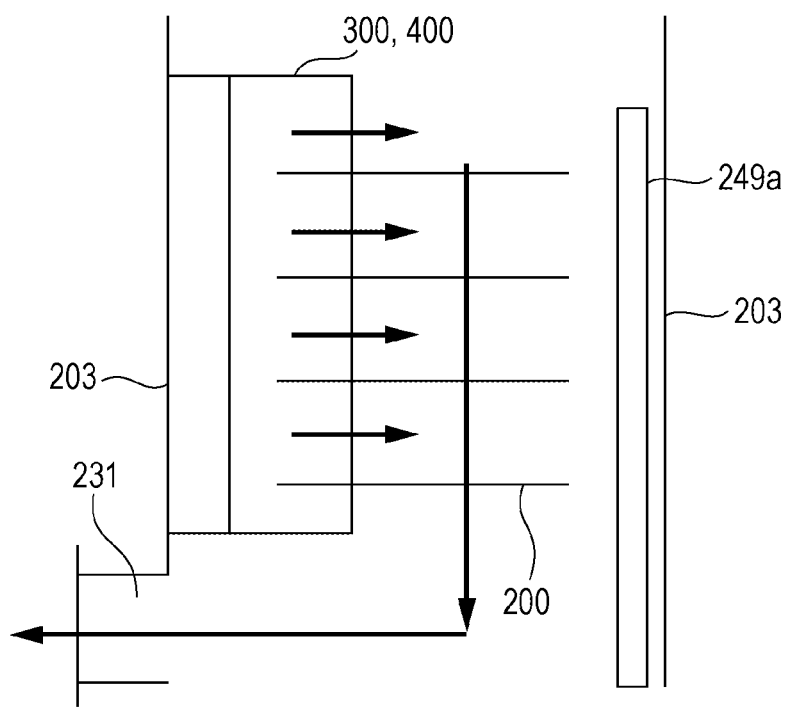
FIG. 9D is a partial longitudinal sectional view illustrating a flow of an activated reactant gas when a loaded wafer is viewed from the side, according to a comparative example.

FIGS. 9C and 9D illustrate the flow of the reactant gas when the activated reactant gas is supplied onto each wafer 200 from the gas supply ports 302, 304, 402, and 404 of the buffer structures 300 and 400. FIG. 9C is a top view illustrating the flow of the activated reactant gas on the surface of the wafer 200, and FIG. 9D is a partial longitudinal sectional view illustrating the flow of the activated reactant gas when the loaded wafer 200 is viewed from the side.

As illustrated in FIG. 9C, on the surface of the wafer 200, the flow (supply amount) of the activated reactant gas in the vicinity of the central portion of the wafer 200 indicated by the dashed arrow may be smaller than the flow (supply amount) of the activated reactant gas in the left-right direction of the wafer 200 indicated by the solid arrow. Similarly to the above, this is because the interval (distance) D between the inner wall of the reaction tube 203 and the outer circumference of the wafer 200 is wide as compared to the interval d3 between the inner wall of the buffer structure 300 and the outer circumference of the wafer 200 in the reaction tube 203 or the interval d4 between the inner wall of the buffer structure 400 and the outer circumference of the wafer 200 in the reaction tube 203. That is, since the distance D is D>d3 or d4, the activated reactant gas is likely to flow downward from the reaction tube 203 through a gap of the interval (distance) D between the inner wall of the reaction tube 203 and the outer circumference of the wafer 200. In addition, as illustrated in FIG. 9D, the activated reactant gas is supplied onto the surface of each wafer 200 from the gas supply ports 302, 304, 402, and 404 of the buffer structures 300 and 400, passes over the surface of each wafer 200, flows below the reaction tube 203 from a gap of the interval (distance) D between the inner wall of the reaction tube 203 and the outer circumference of the wafer 200, as indicated by the downward arrow in FIG. 9D, and is then exhausted from the exhaust pipe 231.

Therefore, the supply amount of the precursor gas and the supply amount of the activated reactant gas in the region around the center of each wafer 200 are smaller than those in the region around the outer circumference of each wafer 200, and thus, the film thickness of the SiN film or the like formed on the surface of each wafer 200 may be non-uniform.

Figure 10A:
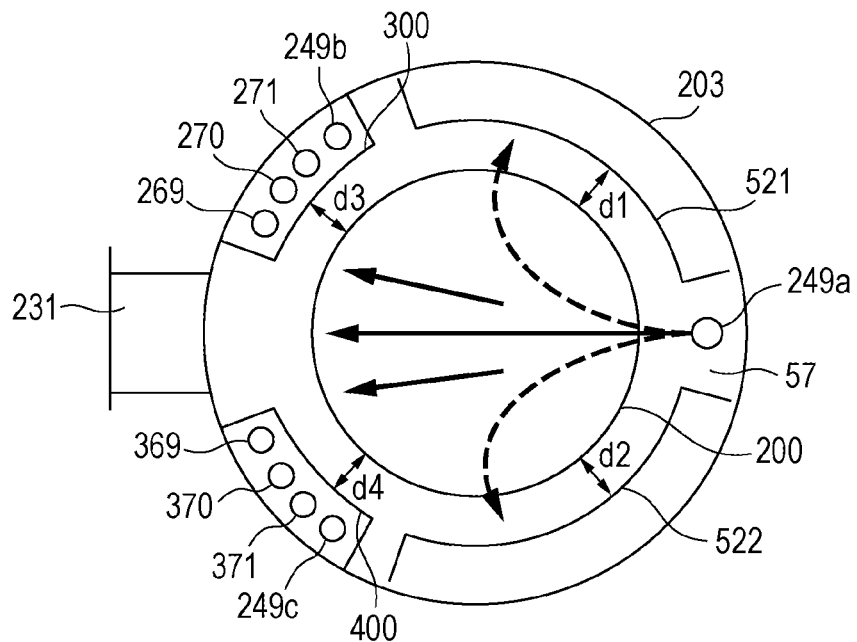
FIG. 10A is a top view illustrating a flow of a precursor gas on a surface of a wafer, according to an embodiment of the present disclosure.
Figure 10B:
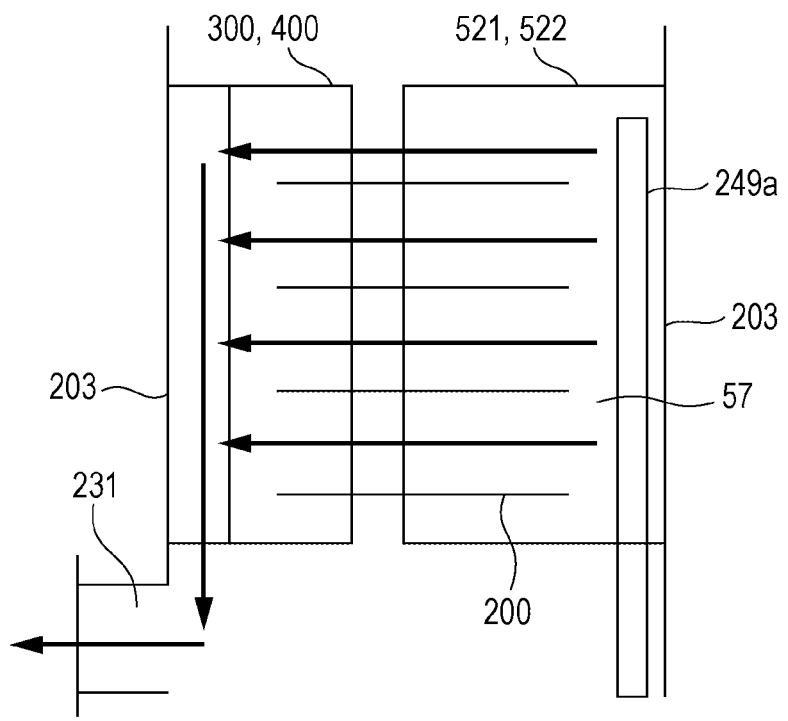
FIG. 10B is a partial longitudinal sectional view illustrating a flow of a precursor gas when a loaded wafer is viewed from the side, according to an embodiment of the present disclosure.

FIGS. 10A and 10B illustrate the flow of the precursor gas when the precursor gas is supplied onto each wafer 200 from the gas supply hole 250a of the nozzle 249a. FIG. 10A is a top view illustrating the flow of the precursor gas on the surface of the wafer 200, and FIG. 10B is a partial longitudinal sectional view illustrating the flow of the precursor gas when the loaded wafer 200 is viewed from the side.

As illustrated in FIG. 10A, on the surface of the wafer 200, the flow (supply amount) of the precursor gas in the left-right direction of the wafer 200 indicated by the dashed arrow is smaller than the flow (supply amount) of the precursor gas in the vicinity of the central portion of the wafer 200 indicated by the solid arrow. The reason for this is because, described above with reference to FIG. 4, the distance d1 between the central partition member 52a and the outer circumferential portion of the wafer 200, the distance d2 between the central partition member 52b and the outer circumferential portion of the wafer 200, the distance d3 between the inner wall of the buffer structure 300 and the outer circumferential portion of the wafer 200 in the reaction tube 203, and the distance d4 between the inner wall of the buffer structure 400 and the outer circumferential portion of the wafer 200 in the reaction tube 203 may be set to substantially the same value.

Therefore, as illustrated in FIG. 10B, the precursor gas is supplied from the gas supply hole 250a of the nozzle 249a onto the surface of each wafer 200 through the opening 57. The precursor gas supplied onto the surface of each wafer 200 from the gas supply hole 250a of the nozzle 249a passes over the surface of each wafer 200 in the vicinity of the central portion, reaches the region of the inner wall of the reaction tube 203 facing the nozzle 249a, that is, the region between the buffer structure 300 and the buffer structure 400, flows below the reaction tube 203, and is then exhausted from the exhaust pipe 231.

Figure 10C:
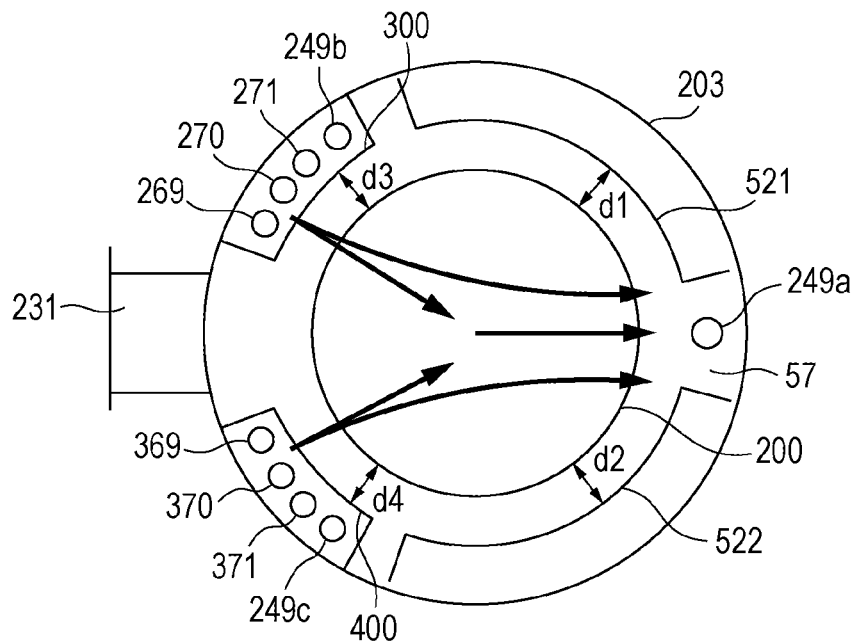
FIG. 10C is a top view illustrating a flow of an activated reactant gas on a surface of a wafer, according to an embodiment of the present disclosure.
Figure 10D:
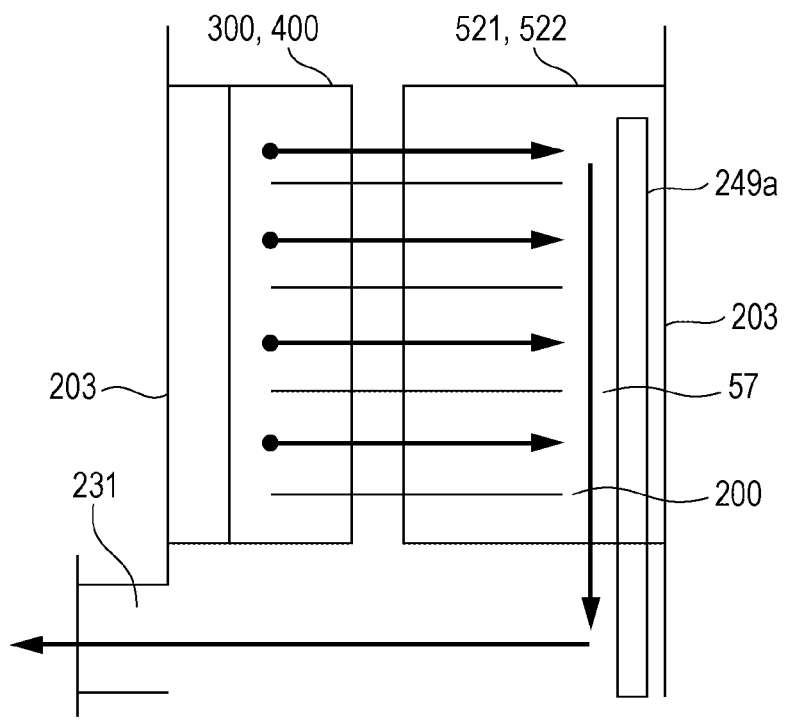
FIG. 10D is a partial longitudinal sectional view illustrating a flow of an activated reactant gas when a loaded wafer is viewed from the side, according to an embodiment of the present disclosure.

FIGS. 10C and 10D illustrate the flow of the reactant gas when the activated reactant gas is supplied onto each wafer 200 from the gas supply ports 302, 304, 402, and 404 of the buffer structures 300 and 400. FIG. 10C is a top view illustrating the flow of the activated reactant gas on the surface of the wafer 200, and FIG. 10D is a partial longitudinal sectional view illustrating the flow of the activated reactant gas when the loaded wafer 200 is viewed from the side.

As illustrated in FIGS. 10C and 10D, the activated reactant gas flows from the gas supply ports 302, 304, 402, and 404 to the vicinity of the central portion of the wafer 200, as indicated by the solid arrow, on the surface of the wafer 200, reaches the outer circumferential region of the wafer 200, and then flows to the vicinity of the opening 57 between the partition members 521 and 522. The activated reactant gas then flows below the reaction tube 203 from the vicinity of the opening 57 and is exhausted from the exhaust pipe 231. This is because the intervals d1, d2, d3, and d4 are set to substantially the same value as described above with reference to FIG. 4.

Therefore, since the precursor gas and the activated reactant gas are rectified in the region around the center of each wafer 200 and then flow, the supply amount of the precursor gas and the supply amount of the activated reactant gas in the region around the center of each wafer 200 are not insufficient and the precursor gas and the activated reactant gas are supplied sufficiently. Therefore, the film thickness of the SiN film or the like formed on the surface of each wafer 200 is made uniform. In addition, the reaction by-product generated on each wafer 200 can be efficiently exhausted from the exhaust pipe 231.

According to the present embodiment, one or more effects described later can be obtained.

1) By providing the gas rectifier 50 in the reaction tube 203, the flow of the precursor gas and the activated reactant gas can be rectified. Therefore, the precursor gas and the activated reactant gas can be efficiently supplied onto each wafer 200.

2) Due to the above 1, the film thickness of the film formed on the surface of each wafer 200 is made uniform.

3) The gas rectifier 50 is disposed in the space other than the position where the nozzle 249a serving as the precursor gas supply section and the buffer structures 300 and 400 (or the buffer chamber 237) serving as the reactant gas supply section are disposed. Therefore, the precursor gas and the reactant gas can be efficiently exhausted. In addition, the reaction by-product generated on each wafer 200 can be efficiently exhausted from the exhaust pipe 231.

4) The buffer structures 300 and 400 (or the buffer chamber 237) serving as the reactant gas supply section have the buffer chamber 237 configured to uniformly supply the reactant gas, and the gas rectifier 50 is disposed such that the gaps (d1 and d2) between the outer circumference of the substrate 200 and the inner wall of the gas rectifier 50 are substantially the same as the gaps (d3 and d4) between the substrate 200 and the buffer chamber 371. Therefore, the flow of the precursor gas and the activated reactant gas on the substrate 200 can be rectified. Furthermore, the precursor gas and the activated reactant gas can be efficiently supplied onto each wafer 200.

5) The nozzle 249a serving as the precursor gas supply section and the buffer structures 300 and 400 (or the buffer chamber 237) serving as the reactant gas supply section are provided so as to be located on the side opposite to the center line passing through the center of the process chamber 201. The gas rectifier 50 is configured to cover the side surface of the substrate 200 other than the position where the precursor gas supply section and the reactant gas supply section are disposed. Therefore, the flow of the precursor gas and the reactant gas on the substrate 200 is rectified. In addition, the precursor gas and the reactant gas can be efficiently exhausted.

Next, other embodiments of the present disclosure will be described with reference to FIG. 11. In the present embodiment, portions different from the above-described embodiment will be described later, and a description of the same portions will be omitted.

In the present embodiment, the configuration is changed such that, for example, hydrogen (H$_2$) gas as the reforming gas is supplied from the nozzle 249c into the process chamber 201. That is, the nozzle 249c is not connected to the gas supply pipe 232b illustrated in FIG. 2, but is modified to a configuration that the nozzle 249c is connected through another MFC and another valve to another gas supply pipe configured to supply hydrogen (H$_2$) gas.

Figure 11:
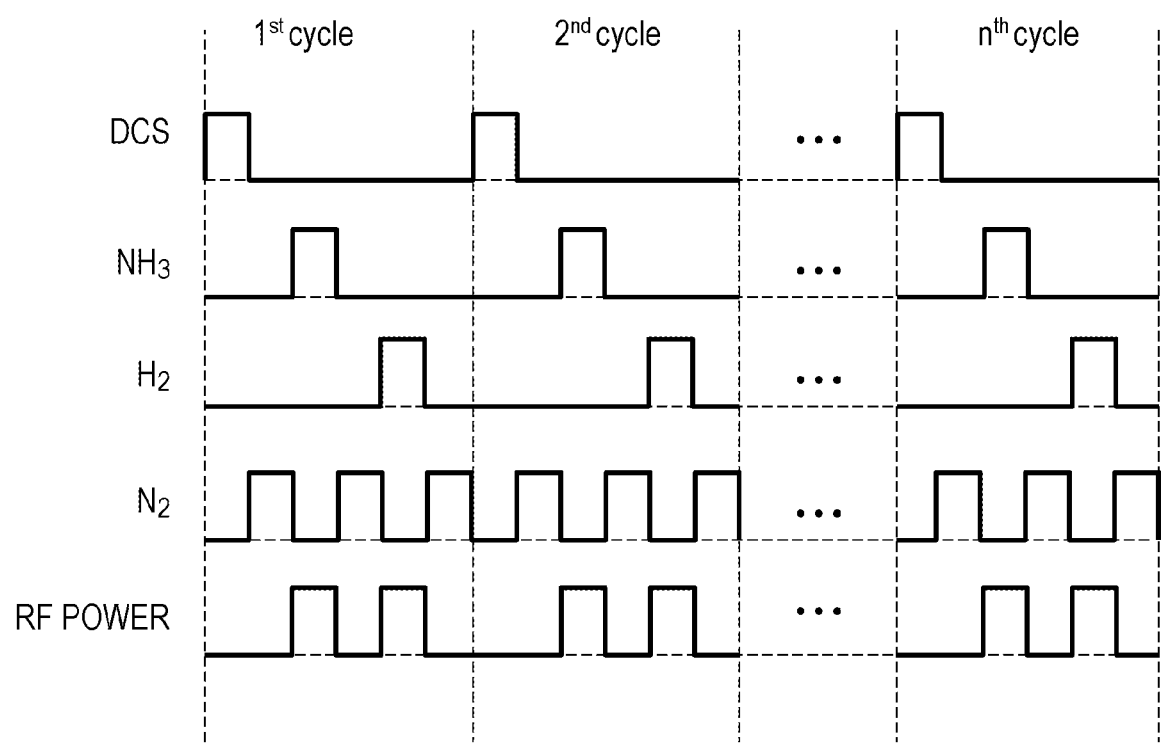
FIG. 11 is a diagram illustrating a gas supply timing in substrate processing process according to another embodiment of the present disclosure.

As illustrated in FIG. 11, a silicon nitride film (SiN film) is formed as a film containing Si and N on a wafer 200 by performing supplying a DCS gas as a precursor gas, supplying a plasma-excited NH$_3$ gas as a reactant gas, and supplying a plasma-excited H$_2$ gas as a reforming gas non-simultaneously, that is, without synchronization, a predetermined number of times (once or more).

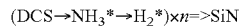

(DCS→NH$_3$*→H$_2$*)×n=>SiN

As described above, the present disclosure can be also applied to a case where the NH$_3$ gas is plasma-excited as the reactant gas from the nozzle 249b and supplied to the wafer and then the H$_2$ gas is plasma-excited and supplied, and the same effects as those of the above-described embodiment can be obtained.

The embodiments of the present disclosure have been described in detail. However, the present disclosure is not limited to the above-described embodiments, and various modifications can be made without departing from the scope of the present disclosure.

In the above embodiment, the case in which there are two buffer structures has been described. However, the present disclosure can be also applied to a case in which there is one buffer structure, a case in which there are a plurality of buffer structures, such as a case in which there are three buffer structures. The same effects as those of the above-described embodiment and modification can be obtained.

In the above-described embodiment, the example in which three electrodes are used as the plasma generator has been described. However, the present disclosure is not limited thereto, and the present disclosure can be also applied to the case of using two electrodes or an odd number of three or more electrodes such as five or seven electrodes. For example, in a case in which the plasma generator is configured using five electrodes, a total of three electrodes, including two electrodes disposed at the outermost position and one electrode disposed at the central position, can be connected to the RF power supplies and can be connected so as to ground two electrodes disposed to be sandwiched between the RF power supplies.

In the above-described embodiment, the example in which the number of electrodes on the RF power supply side is larger than the number of electrodes on the ground side and the electrodes on the ground side are common to the electrodes on the RF power supply side has been described. However, the present disclosure is not limited thereto, and the number of electrodes on the ground side may be larger than the number of electrodes on the RF power supply and the electrodes on the RF power supply are common to the electrodes on the ground side. However, when the number of electrodes on the ground side is larger than the number of electrodes on the RF power supply side, it is preferable to increase the power applied to the electrodes on the RF power supply side and many particles are generated. Therefore, it is more desirable that the number of electrodes on the RF power supply side is set to be larger than the number of electrodes on the ground side.

Furthermore, in the above-described embodiment, the example in which the reactant gas is supplied after the precursor is supplied has been described. However, the present disclosure is not limited to the embodiments, and the supply order of the precursor and the reactant gas may be reversed. That is, the precursor may be supplied after the reactant gas is supplied. By changing the supply order, it is possible to change the film quality or the composition ratio of the film to be formed.

As described above, according to the present disclosure, a technology capable of uniformly processing a substrate can be provided.

According to the present disclosure, it is possible to provide the technology capable of processing the substrate uniformly.

The invention claimed is:
1. A substrate processing apparatus comprising:
a process chamber configured to process a substrate;
a precursor gas supply section provided in the process chamber and configured to supply a precursor gas;
a reactant gas supply section provided in the process chamber and configured to supply a reactant gas;
an exhauster configured to exhaust the process chamber;
a plasma generator including a first plasma generator and a second plasma generator configured to convert the reactant gas into plasma, wherein the first plasma generator and the second plasma generator are disposed so that a straight line passing through the center of the process chamber and the exhauster is interposed therebetween; and
a gas rectifier including a first partition member disposed at a certain distance from an edge portion of the substrate along an inner wall of the process chamber between the precursor gas supply section and the first plasma generator, and a second partition member disposed at a certain distance from the edge portion of the substrate along an inner wall of the process chamber between the precursor gas supply section and the second plasma generator, wherein a first plate member and a second plate member are provided at both ends of the first partition member in a direction toward the inner wall of the process chamber so as to form a gap with the inner wall of the process chamber, and a third plate member and a fourth plate member are provided at both ends of the second partition member in the direction toward the inner wall of the process chamber so as to form a gap with the inner wall of the process chamber.

2. The substrate processing apparatus according to claim 1, wherein the precursor gas supply section and the exhauster are provided at opposite positions at least when seen in a plan view.

3. The substrate processing apparatus according to claim 1, wherein each of the first partition member and the second partition member has a space between each of the first partition member and the second partition member and a wall of the process chamber.

4. The substrate processing apparatus according to claim 1, wherein the first plate member of the first partition member and the third plate member of the second partition member are provided on the precursor gas supply section side, and an angle formed by a line segment connecting the first plate member and the center of the substrate and a line segment connecting the third plate member and the center of the substrate is 10 degrees or more and 30 degrees or less.

5. The substrate processing apparatus according to claim 1, wherein an opening is provided between the first partition member and the second partition member, and the precursor gas is supplied to the substrate through the opening.

6. The substrate processing apparatus according to claim 5, wherein the reactant gas is exhausted from the exhauster through the opening.

7. The substrate processing apparatus according to claim 1, wherein the first plasma generator is provided in a first buffer structure, the second plasma generator is provided in a second buffer structure, and an interval between the edge portion of the substrate and an inner wall of the first buffer structure is the same as an interval between the edge portion of the substrate and an inner wall of the second buffer structure.

8. The substrate processing apparatus according to claim 7, wherein an interval between the edge portion of the substrate and the first partition member, an interval between the edge portion of the substrate and the second partition member, the interval between the edge portion of the substrate and the inner wall of the first buffer structure, and the interval between the edge portion of the substrate and the inner wall of the second buffer structure are the same.

9. The substrate processing apparatus according to claim 1, wherein each of the first plasma generator and the second plasma generator comprises at least two first electrodes connected to a radio frequency power supply, and a second electrode grounded between the at least two first electrodes.

* * * * *